United States Patent
Yoon et al.

(10) Patent No.: US 11,830,893 B2
(45) Date of Patent: Nov. 28, 2023

(54) IMAGE SENSING DEVICE

(71) Applicant: SK hynix Inc., Icheon-si (KR)

(72) Inventors: Hyung June Yoon, Icheon-si (KR); Jong Eun Kim, Icheon-si (KR); Jong Chae Kim, Icheon-si (KR); Jae Won Lee, Icheon-si (KR); Jae Hyung Jang, Icheon-si (KR); Hoon Moo Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 108 days.

(21) Appl. No.: 17/463,310

(22) Filed: Aug. 31, 2021

(65) Prior Publication Data

US 2022/0102395 A1 Mar. 31, 2022

(30) Foreign Application Priority Data

Sep. 29, 2020 (KR) .................. 10-2020-0126884

(51) Int. Cl.
*H01L 27/146* (2006.01)
*G01S 7/4863* (2020.01)
*H04N 25/76* (2023.01)

(52) U.S. Cl.
CPC ........ *H01L 27/1461* (2013.01); *G01S 7/4863* (2013.01); *H04N 25/76* (2023.01)

(58) Field of Classification Search
CPC .... G01S 17/894; G01S 7/4816; G01S 7/4863; H01L 27/1461; H04N 25/76
See application file for complete search history.

(56) References Cited

U.S. PATENT DOCUMENTS

| | | | | |
|---|---|---|---|---|
| 11,218,657 B2* | 1/2022 | Jang | ...................... | G01S 17/894 |
| 11,363,224 B2* | 6/2022 | Jang | ...................... | G01S 17/894 |
| 11,417,692 B2* | 8/2022 | Jang | .................. | H01L 27/14605 |
| 11,699,391 B2* | 7/2023 | Kimura | ................ | G09G 3/3225 |
| | | | | 345/55 |
| 2018/0372846 A1 | 12/2018 | Izuhara | | |
| 2021/0281791 A1* | 9/2021 | Jang | .................. | H01L 27/14812 |
| 2021/0288088 A1* | 9/2021 | Jang | .................. | H01L 27/14612 |
| 2021/0368122 A1* | 11/2021 | Jang | ....................... | G01S 7/4816 |

FOREIGN PATENT DOCUMENTS

| | | |
|---|---|---|
| JP | 2018117117 A | 7/2018 |
| JP | 2020013906 A | 1/2020 |

* cited by examiner

*Primary Examiner* — Antoinette T Spinks
(74) *Attorney, Agent, or Firm* — Perkins Coie LLP

(57) ABSTRACT

An image sensing device is provided to include a pixel array having a plurality of pixels arranged in a matrix shape. Each of the pixels includes: a control node configured to generate a hole current in a substrate; a detection node configured to capture photocharge migrated by the hole current, formed in a shape whose at least part is partially open, and disposed to surround the control node, and a low resistance region including a dielectric layer formed in the substrate, and disposed in the opening on of the detection node. The low resistance region includes an inner low resistance region disposed between the control node and the center of the pixel.

19 Claims, 26 Drawing Sheets

- First Tap Group
- Second Tap Group
- ⊗ Current Path Control Area
- ○ Voltage Stabilization Area
- □ Pixel Transistor Area

- First Tap Group(ON)
- Second Tap Group(OFF)
- ⊗ Current Path Control Area
- Voltage Stabilization Area
- Pixel Transistor Area

| ·········▶ | HC3 |
| ---------▶ | HC5 |
| ── ── ─▶ | HC6 |
| ──··──▶ | HC7 |

IMAGE SENSING DEVICE

CROSS-REFERENCES TO RELATED APPLICATION

This patent document claims priority and benefits of Korean application number 10-2020-0126884, filed on Sep. 29, 2020, which is incorporated herein by reference in its entirety as part of the disclosure of this patent document.

TECHNICAL FIELD

Various embodiments generally relate to an image sensing device for sensing a distance to a target object.

BACKGROUND

An image sensing device is used in electronic devices to capture optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

Image sensing devices may be roughly classified into CCD (Charge Coupled Device) image sensing devices and CMOS (Complementary Metal Oxide Semiconductor) image sensing devices. The CCD image sensing devices create high-quality, low noise images, and traditionally have advantages over the CMOS image sensor in terms of noise characteristics. However, the CMOS image sensing devices are now widely used due to certain advantages over the CCD counterparts, including, e.g., smaller size and less power consumption. Furthermore, CMOS sensors and signal processing circuitry can be integrated into a single chip, making it possible to miniaturize electronic devices and reduce fabrication costs. Such characteristics of the CMOS image sensing devices are better suited for implementations in mobile devices.

SUMMARY

Various embodiments are directed to an image sensing device including CAPD pixels having excellent characteristics.

In an embodiment, an image sensing device is provided to include a pixel array having a plurality of pixels arranged in a matrix shape. Each of the pixels includes: a control node configured to generate a hole current in a substrate; a detection node configured to capture photocharge migrated by the hole current, formed in a shape whose at least part is partially open, and disposed to surround the control node, and a low resistance region including a dielectric layer formed in the substrate, and disposed in the opening of the detection node. The low resistance region includes an inner low resistance region disposed between the control node and the center of the pixel.

In an embodiment, an image sensing device is provided to include a pixel array having a plurality of pixels arranged in a matrix shape. Each of the pixels includes: a control node configured to generate a hole current in a substrate; a detection node configured to capture photocharge migrated by the hole current; and a low resistance region including a dielectric layer formed in the substrate. The detection node and the low resistance region form a ring shape to surround the control node, and the depth of a depletion region under the detection node is larger than the depth of the dielectric layer of the low resistance region.

Some embodiments of the disclosed technology provide tap structures of pixels, which allow to control a flow of a hole current. It is possible to improve the sensitivity and demodulation contrast of the pixels.

In addition, it is possible to provide various effects which are directly or indirectly identified.

DETAILED DESCRIPTION

Hereafter, various specific implementations of certain embodiments of the disclosed technology are described with reference to the accompanying drawings. However, it should be understood that the disclosed technology is not limited to specific implantations of the disclosed embodiments, and various modifications, equivalents and/or alternatives of the disclosed embodiments may be made based on what is disclosed in this patent document.

Technologies of measuring a depth (e.g., a distance to a target object) using an image sensor have been being developed through much research, and demand for the technologies of measuring the depth have been increasing in various devices such as security devices, medical devices, vehicles, game machines, virtual reality (VR)/augmented reality AR devices, and mobile device. Examples of methods of measuring a depth may include triangulation, ToF (Time of Flight) and interferometry. Among the above-mentioned depth measurement methods, the time of flight (ToF) method becomes popular because of its wide range of utilization, high processing speed, and cost advantages. The ToF method measures a distance using emitted light and reflected light. The ToF method may be roughly classified into a direct method and an indirect method, depending on whether it is a round-trip time or the phase difference that determines the distance. The direct method may measure a distance by calculating a round trip time and the indirect method may measure a distance using a phase difference. Since the direct method is suitable for measuring a long distance, the direct method is widely used in automobiles. The indirect method is suitable for measuring a short distance and thus widely used in various higher-speed devices designed to operate at a higher speed, for example, game consoles or mobile cameras. As compared to the direct type ToF systems, the indirect method has several advantages including having a simpler circuitry, low memory requirement, and a relatively lower cost.

A CAPD (Current-Assisted Photonic Demodulator) method is one type of pixel circuitry used in an indirect ToF sensor. In CAPD, electrons are generated in a pixel circuit by a majority current that is created through an application of a substrate voltage, and the generated electrons are detected by using a potential difference between electric fields. Since the majority current is used, the CAPD can rapidly detect electrons. In addition, the CAPD has an excellent efficiency by detecting some electrons formed at a deep depth.

Figure 1:
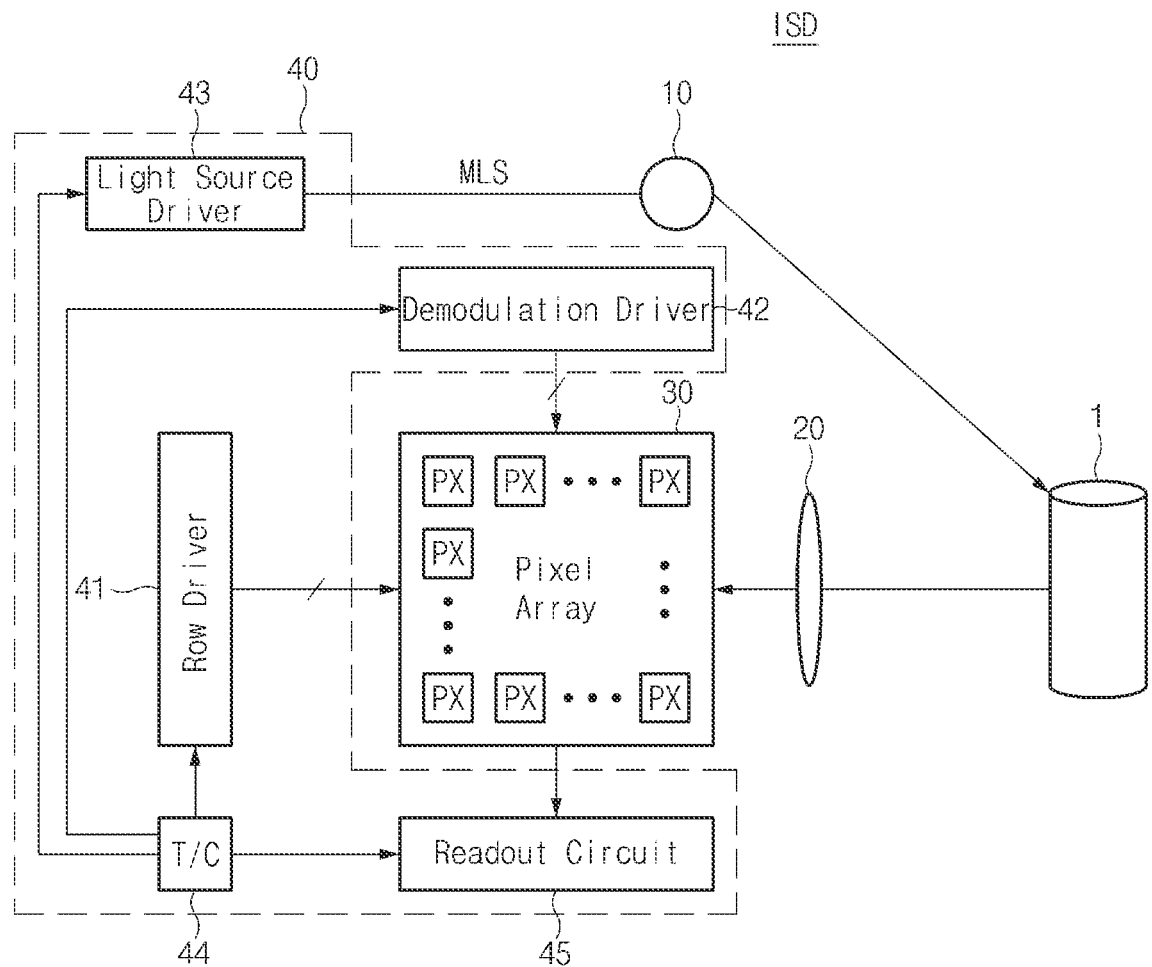
FIG. 1 is a configuration diagram schematically illustrating a configuration of an image sensing device in accordance with some embodiments of the disclosed technology.

FIG. 1 is a configuration diagram schematically illustrating a configuration of an image sensing device in accordance with embodiments.

Referring to FIG. 1, an image sensing device ISD may measure a distance to a target object 1 using a ToF (Time of Flight) method. Such an image sensing device ISD may include a light source 10, a lens module 20, a pixel array 30 and a control block 40.

The light source 10 emits light onto the target object 1 in response to a light modulation signal MLS received from the control block 40. The light source 10 may be an LD (laser Diode) or LED (Light Emitting Diode) which emits a specific wavelength range of light (for example, near-infrared light, infrared light or visible light), NIR (Near Infrared Laser), a point light source, a white lamp, a monochromatic light source having monochromators combined therein, or a combination of other laser light sources. For example, the light source 10 may emit infrared light having a wavelength of 800 nm to 1,000 nm. The light emitted from the light source 10 may be light modulated at a predetermined frequency. FIG. 1 illustrates only one light source 10, for convenience of description. However, a plurality of light sources may be arranged around the lens module 20.

The lens module 20 may collect light reflected from the target object 1 and focus the collected light on pixels PX of the pixel array 30. For example, the lens module 20 may include a focusing lens with a glass or plastic surface or a cylindrical optical element. The lens module 20 may include a plurality of lenses aligned with an optical axis.

The pixel array 30 may include a plurality of unit pixels PX which are successively arranged in a 2D matrix, for example, a plurality of unit pixels PX which are successively arranged in column and row directions. The unit pixels PX may be formed on a semiconductor substrate, and each of the unit pixels PX may convert light, incident through the lens module 20, into an electrical signal corresponding to the intensity of the light, and output the electrical signal as a pixel signal. At this time, the pixel signal may be a signal which does not indicate the color of the target object 1, but indicates the distance to the target object 1. Each of the unit pixels PX may be a CAPD (Current-Assisted Photonic Demodulator) pixel. The more detailed structure and operation of the unit pixel PX will be described below with reference to FIG. 2 and the followings.

The control block 40 may control the light source 10 to emit light onto the target object 1, and drive the unit pixels PX of the pixel array 30 to process pixel signals corresponding to light reflected from the target object 1, thereby measuring the distance to the surface of the target object 1.

Such a control block 40 may include a row driver 41, a demodulation driver 42, a light source driver 43, a timing controller 44 and a readout circuit 45.

The row driver 41 and the demodulation driver 42 may be collectively referred to as a control circuit.

The control circuit may drive the unit pixels PX of the pixel array 30 in response to a timing signal outputted from the timing controller 44.

The control circuit may generate a control signal capable of selecting and controlling one or more row lines among a plurality of row lines of the pixel array 30. Such a control signal may include a demodulation control signal for generating a charge current (e.g., a hole current) within a substrate, a reset signal for controlling a reset transistor, a transmission signal for controlling transfer of photocharge accumulated in a detection node, a boosting signal for providing an additional capacitance, and a selection signal for controlling a selection transistor.

The row driver 41 may generate the reset signal, the transmission signal, the boosting signal and the selection signal, and the demodulation driver 42 may generate the demodulation control signal.

The light source driver 43 may generate the light modulation signal MLS capable of driving the light source 10, under control of the timing controller 44. The light modulation signal MLS may be a signal modulated at a predetermined frequency.

The timing controller 44 may generate a timing signal for controlling the operations of the row driver 41, the demodulation driver 42, the light source driver 43 and the readout circuit 45.

The readout circuit 45 may generate pixel data in the form of digital signals by processing pixel signals outputted from the pixel array 30, under control of the timing controller 44.

For this operation, the readout circuit 45 may include a CDS (Correlated Double Sampler) for performing correlated double sampling on the pixel signals outputted from the pixel array 30. The readout circuit 45 may include an analog-digital converter for converting the output signals from the CDS into digital signals. Furthermore, the readout circuit 45 may include a buffer circuit for temporarily storing pixel data outputted from the analog-digital converter and outputting the pixel data to the outside under control of the timing controller 44. As the pixel array 30 is composed of CAPD pixels, each column of the pixel array 30 may include two column lines for transferring pixel signals, and components for processing pixel signals outputted from the column lines may also be provided for the respective column lines.

The light source 10 may emit light, modulated at a predetermined frequency, toward a scene captured by the image sensing device ISD, and the image sensing device ISD may sense modulated light (i.e. incident light) reflected from target objects 1 within the scene, and generate depth information on each of the unit pixels PX. The modulated light and the incident light have a time delay present therebetween, due to the distance between the image sensing device ISD and the target object 1. Such a time delay appears as a phase difference between a signal generated by the image sensing device ISD and the light modulation signal MLS (modulated light signal) for controlling the light source 10. An image processor (not illustrated) may generate a depth image containing depth information on each of the unit pixels PX by calculating a phase difference which occurs in a signal outputted from the image sensing device ISD.

Figure 2:
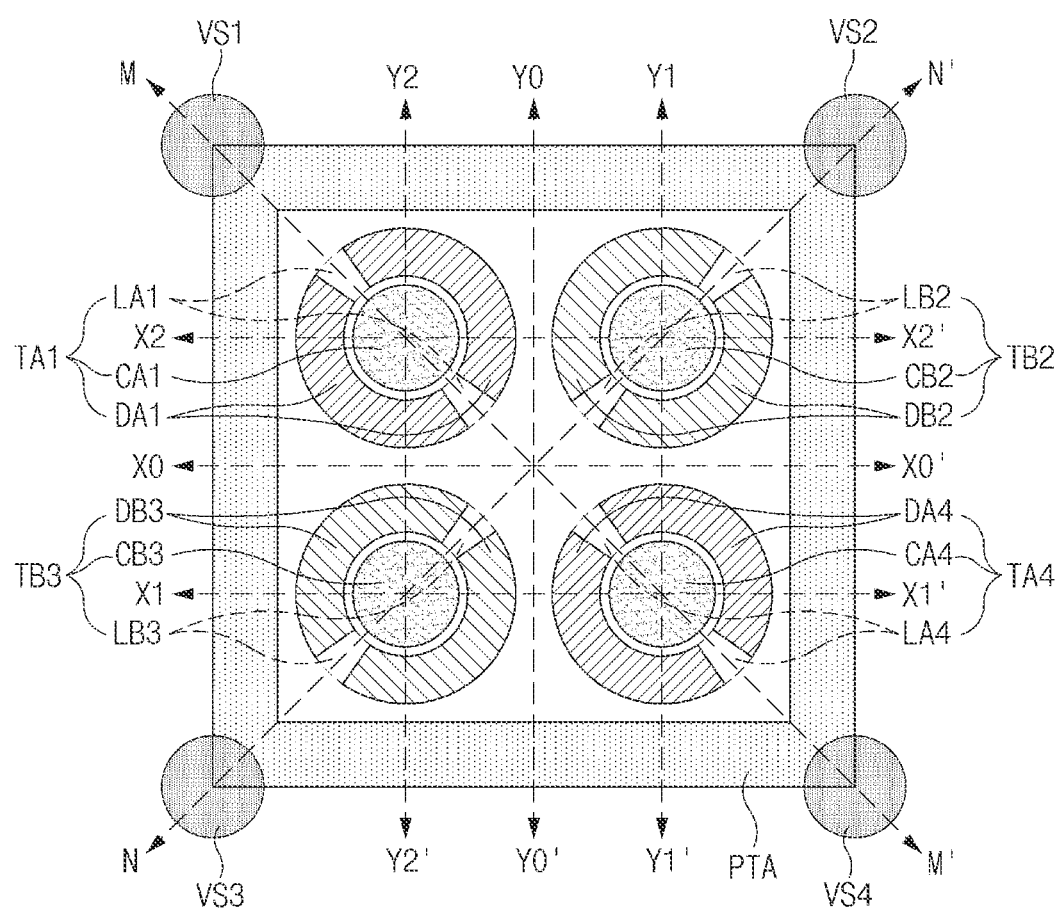
FIG. 2 is a diagram illustrating an example of a layout of a pixel illustrated in FIG. 1.

FIG. 2 is a diagram briefly illustrating an example of the layout of a pixel illustrated in FIG. 1.

Referring to FIG. 2, a pixel 200 may be any one of the pixels PX illustrated in FIG. 1. For convenience of description, only one pixel 200 is shown in FIG. 2 but the same structure and operation will be applied to other pixels included in the pixel array 30.

The pixel 200 may include detection structures for collecting and detecting photocharge produced by the pixel. Each detection structure is referred to as a tap and includes a control node configured to receive a control signal and a detection node disposed adjacent to the control node to collect and detect photocharge generated by the pixel in response to incident light. The example in FIG. 2 shows four such taps: a first tap TA1, a second tap TB2, a third tap TB3, a fourth tap TA4. The pixel also includes a pixel transistor area PTA and first to fourth voltage stabilization areas VS1 to VS4. Other implementations may be designed to include a different number of taps. For example, one pixel PX may include N taps where N can be less than four or greater than four. The plurality of taps may receive the same or different types of demodulation control signals. The different types of demodulation control signals may indicate demodulation control signals received at different timings.

The first tap TA1 and the fourth tap TA4 may be defined as a first tap group which receives the same demodulation control signals, and the second tap TB2 and the third tap TB3 may be defined as a second tap group which receives the same demodulation control signals. The first tap group and the second tap group may receive different demodulation control signals. The demodulation control signal received by the first tap group may be defined as a first demodulation control signal, and the demodulation control signal received by the second tap group may be defined as a second demodulation control signal.

The first tap TA1 and the fourth tap TA4 may be disposed in a first diagonal direction that crosses the center of the pixel 200, and the second tap TB2 and the third tap TB3 may be disposed in a second diagonal direction that crosses the center of the pixel 200. The first diagonal direction may indicate the direction of a straight line M-M' passing through a first vertex positioned at the left top of the pixel 200 and a fourth vertex positioned at the right bottom of the pixel 200, and the second diagonal direction may indicate the direction of a straight line N-N' passing through a second vertex positioned at the right top of the pixel 200 and a third vertex positioned at the left bottom of the pixel 200. Therefore, the first tap TA1 and the fourth tap TA4 may be disposed to face each other in the first diagonal direction with respect to the center of the pixel 200, and the second tap TB2 and the third tap TB3 may be disposed to face each other in the second diagonal direction with respect to the center of the pixel.

The first tap TA1 may include a first control node CA1, a first detection node DA1 surrounding the first control node CA1, and first low resistances regions LA1.

FIG. 2 illustrates that the first control node CA1 has a circular shape, and the first detection node DA1 has a shape having an open (or empty or disconnected) part. For example, the first detection node DA1 has a ring shape which is partially open. However, other implementations are also possible. The ring shape of the first detection node DA1 allows to surround areas of the first control node CA1 as large as possible. The ring-shaped first detection node DA1 can help to more easily capture signal carriers which migrate along a charge current (e.g., a hole current) caused by the first control node CA1.

In the open (or disconnected) region of the ring-shaped first detection node DA1, the first low resistance region LA1 may be disposed. Therefore, the first detection node DA1 and the first low resistance region LA1 may form a ring shape to completely surround the first control node CA1. The first low resistance regions LA1 may be disposed on both sides of the first control node CA1 in the first diagonal direction so as to face each other.

The first low resistance region LA1 may indicate a region having lower resistance than the first detection node DA1. Since the first low resistance region LA1 has lower resistance than the first detection node DA1, the charge current (e.g., a hole current) outputted from the first control node CA1 has a lower resistance in a path passing through the first low resistance region LA1 (for example, under the first low resistance region LA1) than that of a path passing through the first detection node DA1 (for example, the bottom of the first detection node DA1). In an embodiment, the first low resistance region LA1 may include a dielectric layer formed by gap-filling a trench (or STI (Shallow Trench Isolation) structure) with a dielectric material, the trench being formed by an STI process.

The first control node CA1 and the first detection node DA1 may be spaced apart, by a predetermined distance, from each other, and the dielectric layer formed by gap-filling the trench, formed through the STI process, with a dielectric material may be disposed between the first control node CA1 and the first detection node DA1, thereby physically isolating the first control node CA1 and the first detection node DA1 from each other.

In accordance with another embodiment, the first control node CA1 and the first detection node DA1 may be disposed to abut on each other. In this case, the first control node CA1 and the first detection node DA1 may be physically isolated from each other only by junction isolation through a counter doping.

The second tap TB2 may include a second control node CB2, a second detection node DB2 surrounding the second control node CB2, and second low resistance regions LB2.

In the open (or disconnected) region of the ring-shaped second detection node DB2, the second low resistance region LB2 may be disposed. Therefore, the second detection node DB2 and the second low resistance regions LB2 may form a ring shape to completely surround the second control node CB2. The second low resistance regions LB2 may be disposed on both sides of the second control node CB2 in the second diagonal direction so as to face each other.

The dispositions and structures of the second control node CB2, the second detection node DB2 and the second low resistance regions LB2 may correspond to those of the first control node CA1, the first detection node DA1 and the first low resistance regions LA1, respectively, except the above-described differences. Therefore, the overlapping descriptions thereof will be omitted herein.

Furthermore, the dispositions and structures of internal components CB3, DB3 and LB3 in the third tap TB3 are substantially the same as those of the internal components CB2, DB2 and LB2 in the second tap TB2, respectively, except the locations where the internal components are disposed. Therefore, the overlapping descriptions thereof will be omitted herein.

Furthermore, the dispositions and structures of the internal components CA4, DA4 and LA4 in the fourth tap TA4 are substantially the same as those of the internal components CA1, DA1 and LA1 of the first tap TA1, respectively, except the locations where the internal components are disposed. Therefore, the overlapping descriptions thereof will be omitted herein.

The pixel transistor area PTA may be disposed in a peripheral region to surround the first to fourth taps TA1, TB2 and TB3 and TA4. The pixel transistor area PTA may include pixel transistors (TX1, RX1, BX1, SF1 and SX1 of FIG. 3) for processing photocharge captured by the first and fourth taps TA1 and TA4 corresponding to the first tap group and pixel transistors (TX2, RX2, BX2, SF2 and SX2 of FIG. 3) for processing photocharge captured by the second and third taps TB2 and TB3 corresponding to the second tap group. In some implementations, the pixel transistors included in the pixel transistor area PTA may be disposed in a line along the boundary between pixels adjacent to each other. However, other implementations are also possible.

The first to fourth voltage stabilization areas VS1 to VS4 may be disposed at first to fourth vertices of the pixel 200, respectively.

Each of the transistors included in the pixel transistor area PTA may include a gate configured as a gate electrode which is disposed on a dielectric layer formed on one surface of a substrate, a source and drain configured as impurity areas which are disposed on both sides of the gate electrode in the substrate, and a channel area which corresponds to a lower region of the gate electrode in the substrate. The source and drain may be surrounded by a P-well doped with P-type impurities at a predetermined concentration, and the P-well may be extended and disposed even in the lower region of the gate electrode. The P-well may also be extended to the bottoms of the first to fourth voltage stabilization areas VS1 to VS4, and surround the first to fourth voltage stabilization areas VS1 to VS4 while abutting on the first to fourth voltage stabilization areas VS1 to VS4. Thus, the P-well surrounding the voltage stabilization areas may be extended to the bottoms of the pixel transistors adjacent thereto.

The first to fourth voltage stabilization areas VS1 to VS4 may be P+ impurity areas doped at a higher concentration than the P-well in the substrate.

The first to fourth voltage stabilization areas VS1 to VS4 may receive a specific voltage (for example, ground voltage), and clamp the voltage of the P-well that abuts on the first to fourth voltage stabilization areas VS1 to VS4 to the specific voltage. The specific voltage may indicate a disable voltage (or ground voltage). The P-well may be disposed at the bottom of the pixel transistor area PTA and form the body of each pixel transistor, and the voltage of the P-well may have an influence on the threshold voltage of each pixel transistor. The first to fourth voltage stabilization areas VS1 to VS4 may clamp the voltage of the P-well, and thus guarantee stable operations of the pixel transistors included in the pixel transistor area PTA.

The first to fourth voltage stabilization areas VS1 to VS4 may be disposed at the boundary between the adjacent pixels, and receive a disable voltage, thereby preventing a hole current from flowing from an enabled control node of a specific pixel to a disabled control node of another pixel adjacent to the specific pixel. Thus, it is possible to reduce crosstalk which occurs as photocharge generated in the specific pixel are migrated to another pixel and captured.

The voltage stabilization areas included in the pixel array 30 may be electrically coupled to each other in a mesh shape. Such a coupling may prevent a phenomenon in which a ground voltage is not normally supplied to a specific voltage stabilization area due to an IR drop of a signal line for supplying the ground voltage.

Figure 3:
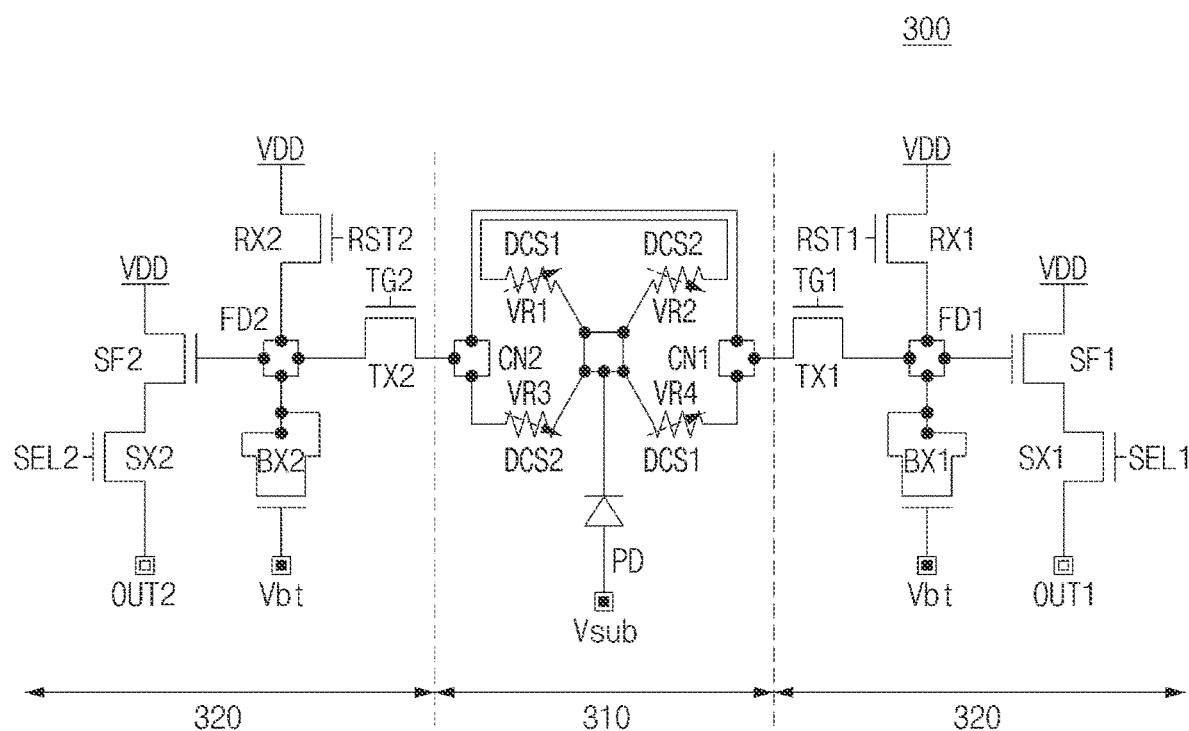
FIG. 3 is a circuit diagram of a pixel illustrated in FIG. 2.

FIG. 3 is a circuit diagram of the pixel illustrated in FIG. 2.

FIG. 3 is a circuit diagram illustrating the pixel 200 of FIG. 2. The pixel 300 may include a photoelectric conversion area 310 and a circuit area 320.

The photoelectric conversion area 310 may include a photoelectric conversion element PD and first to fourth variable resistors VR1 to VR4.

The photoelectric conversion element PD may generate and accumulate photocharge corresponding to the intensity of incident light.

As described above, the first to fourth taps TA1, TB2, TB3 and TA4 may be formed in the substrate. As light is incident on a region inside the substrate except the first to fourth taps TA1, TB2, TB3 and TA4 (e.g., a region other than the regions where the control nodes and the detection nodes are formed on the cross-section), photocharge corresponding to the intensity of the incident light may be generated and accumulated. That is, the photoelectric conversion element PD may correspond to the region inside the substrate except the first to fourth taps TA1, TB2, TB3 and TA4.

One side of the photoelectric conversion element PD may be coupled to the first to fourth variable resistors VR1 to VR4, and the other side of the photoelectric conversion element PD may receive a substrate voltage Vsub. The substrate voltage Vsub may be a substrate voltage applied to a fifth doping region 1007 which will be described with reference to FIG. 10A.

The first variable resistor VR1 may be coupled between the one side of the photoelectric conversion element PD and a first common node CN1. The first variable resistor VR1 may transfer the photocharge accumulated in the photoelectric conversion element PD to the first common node CN1 in response to a first demodulation control signal DCS1. The first demodulation control signal DCS1 may have an enable voltage (for example, 1.2V) and a disable voltage (for example, 0V).

When the first demodulation control signal DCS1 has an enable voltage, the first variable resistor VR1 may have relatively low resistance, and the photocharge accumulated in the photoelectric conversion element PD may be transferred to the first common node CN1. On the other hand, when the first demodulation control signal DCS1 has a disable voltage, the first variable resistor VR1 may have relatively high resistance, and the photocharge accumulated in the photoelectric conversion element PD may not be transferred to the first common node CN1.

The second variable resistor VR2 may be coupled between the one side of the photoelectric conversion element PD and a second common node CN2. The second variable resistor VR2 may transfer the photocharge accumulated in the photoelectric conversion element PD to the second common node CN2 in response to a second demodulation control signal DCS2. The second demodulation control signal DCS2 may have an enable voltage (for example, 1.2V) and a disable voltage (for example, 0V).

When the second demodulation control signal DCS2 has an enable voltage, the second variable resistor VR2 may have relatively low resistance, and the photocharge accumulated in the photoelectric conversion element PD may be transferred to the second common node CN2. On the other hand, when the second demodulation control signal DCS2 has a disable voltage, the second variable resistor VR2 may have relatively high resistance, and the photocharge accumulated in the photoelectric conversion element PD may not be transferred to the second common node CN2.

The third variable resistor VR3 may be coupled between the one side of the photoelectric conversion element PD and the second common node CN2 in parallel to the second variable resistor VR2, and transfer the photocharge accumulated in the photoelectric conversion element PD to the second common node CN2 in response to the second demodulation control signal DCS2. Since the operation of the third variable resistor VR3 is performed in substantially the same manner as the second variable resistor VR2, the overlapping descriptions thereof will be omitted herein.

The fourth variable resistor VR4 may be coupled between the one side of the photoelectric conversion element PD and the first common node CN1 in parallel to the first variable resistor VR1, and transfer the photocharge accumulated in the photoelectric conversion element PD to the first common node CN1 in response to the first demodulation control signal DCS1. Since the operation of the fourth variable resistor VR4 is performed in substantially the same manner as the first variable resistor VR1, the overlapping descriptions thereof will be omitted herein.

The first to fourth variable resistors VR1 to VR4 may correspond to components configured by modeling the first to fourth taps TA1, TB2, TB3 and TA4 as circuit elements, respectively.

Hereafter, the actual operations of the first to fourth taps TA1, TB2, TB3 and TA4 will be described. Since the operation of the third tap TB3 and the operation of the fourth tap TA4 correspond to the operation of the second tap TB2 and the operation of the first tap TA1, respectively, the following descriptions will be focused on the operations of the first and second taps TA1 and TB2.

The first tap TA1 may include the first control node CA1 and the first detection node DA1, and the second tap TB2 may include the second control node CB2 and the second detection node DB2.

The first and second control nodes CA1 and CB2 and the first and second detection nodes DA1 and DB2 may be formed in a substrate. For example, the substrate may be a P-type semiconductor substrate, the first and second control nodes CA1 and CB2 may be P-type impurity regions, and the first and second detection nodes DA1 and DB2 may be N-type impurity regions.

The first and second control nodes CA1 and CB2 may receive the first and second demodulation control signals DCS1 and DCS2 from the demodulation driver 42, respectively. A potential difference between the first and second demodulation control signals DCS1 and DCS2 generates a hole current to control a flow of photocharge which is a signal carrier generated in the substrate by incident light. When the potential of the first demodulation control signal DCS1 is higher than that of the second demodulation control signal DCS2, the hole current flows from the first control node CA1 to the second control node CB2. When the potential of the first demodulation control signal DCS1 is lower than that of the second demodulation control signal DCS2, the hole current flows from the second control node CB2 to the first control node CA1.

Each of the first and second detection nodes DA1 and DB2 may perform a function of capturing and accumulating photocharge which migrates along the flow of the hole current.

In accordance with an embodiment, a photocharge capturing operation of the photoelectric conversion area 310 may be performed during a first interval and a second interval subsequent to the first interval. The descriptions of the present disclosure may be based on the supposition that the first to fourth taps TA1, TB2, TB3 and TA4 operate according to a 2-phase demodulation method which uses two kinds of demodulation control signals. In accordance with another embodiment, however, the first to fourth taps TA1, TB2, TB3 and TA4 may operate according to a 4-phase demodulation method which uses four kinds of demodulation control signals.

In the first interval, the light incident into the pixel 300 may be photoelectrically converted according to the photoelectric effect, and generate an electron-hole pair corresponding to the intensity of the incident light. In the present disclosure, the electron generated in response to the intensity of the incident light may indicate photocharge. At this time, the demodulation driver 42 may apply the first demodulation control signal DCS1 to the first control node CA1, and apply the second demodulation control signal DCS2 to the second control node CB2. The voltage of the first demodulation control signal DCS1 may be higher than that of the second demodulation control signal DCS2. Thus, the voltage of the first demodulation control signal DCS1 may be an enable voltage (for example, 1.2V) and the voltage of the second demodulation control signal DCS2 may be a disable voltage (for example, 0V). As discussed above, the enable voltage allows the transfer of the photocharges from a corresponding photoelectric conversion element PD to a corresponding control node and the disable voltage disallows the transfer of the photocharges from the corresponding photoelectric conversion element PD to the corresponding control node.

A voltage difference between the first and second demodulation control signals DCS1 and DCS2 may generate an electric field between the first and second control nodes CA1 and CB2, and a hole current may flow from the first control node CA1 to the second control node CB2. That is, holes within the substrate migrate toward the second control node CB2, and electrons within the substrate migrate toward the first control node CA1.

Electrons may be generated in the substrate based on the luminous intensity of incident light, and migrate toward the first control mode CA1 so as to be captured by the first detection node DA1 adjacent to the first control node CA1. Therefore, the electrons within the substrate may be used as signal carriers for detecting the luminous intensity of the incident light.

In the second interval succeeding the first interval, incident light incident into the pixel 300 may be photoelectrically converted according to the photoelectric effect, and generate an electron-hole pair corresponding to the intensity of the incident light. At this time, the demodulation driver 42 may apply the first demodulation control signal DCS1 to the first control node CA1, and apply the second demodulation control signal DCS2 to the second control node CB2. The voltage of the first demodulation control signal DCS1 may be lower than that of the second demodulation control signal DCS2. At this time, the voltage of the first demodulation control signal DCS1 may be a disable voltage (for example, 0V) and the voltage of the second demodulation control signal DCS2 may be an enable voltage (for example, 1.2V).

A voltage difference between the first and second demodulation control signals DCS1 and DCS2 may generate an electric field between the first and second control nodes CA1 and CB2, and a hole current may flow from the second control node CB2 to the first control node CA1. That is, holes within the substrate migrate toward the first control node CA1, and electrons within the substrate migrate toward the second control node CB2.

Electrons may be generated in the substrate based on the luminous intensity of incident light, and migrate toward the second control node CB2 so as to be captured by the second detection node DB2 adjacent to the second control node CB2. Therefore, the electrons within the substrate may be used as signal carriers for detecting the luminous intensity of the incident light.

In accordance with an embodiment, the order of the first and second intervals may be changed.

In the first interval in which the first demodulation control signal DCS1 having an enable voltage is applied to the first and fourth taps TA1 and TA4 and the second demodulation control signal DCS2 having a disable voltage is applied to the second and third taps TB2 and TB3, photocharge generated in the substrate may be captured by the first and fourth taps TA1 and TA4, and accumulated in the first common node CN1. The first and fourth detection nodes DA1 and DA4 may be electrically coupled to each other to form the first common node CN1 as one node.

In the second interval in which the first demodulation control signal DCS1 having a disable voltage is applied to the first and fourth taps TA1 and TA4 and the second demodulation control signal DCS2 having an enable voltage is applied to the second and third taps TB2 and TB3, photocharge generated in the substrate may be captured by the second and third taps TB2 and TB3, and accumulated in the second common node CN2. The second and third detection nodes DB2 and DB3 may be electrically coupled to each other to form the second common node CN2 as one node.

The circuit area 320 may include a plurality of elements for converting the photocharge, captured by the first to fourth detection nodes DA1, DB2, DB3 and DA4, into electric signals by processing the photocharge. Control signals RST1, RST2, TG1, TG2, SEL1, SEL2 and Vbt supplied to the plurality of elements may be supplied from the row driver 41. A pixel voltage VDD may be a supply voltage.

First, the elements for processing the photocharge accumulated in the first common node CN1 will be described. The circuit area 320 may include a first reset transistor RX1, a first transmission transistor TX1, a first boosting transistor BX1, a first source follower transistor SF1 and a first selection transistor SX1.

The first reset transistor RX1 may be turned on in response to a logic high level of a first reset signal RST1 supplied to a gate of the first reset transistor RX1, and thus reset the potentials of a first floating diffusion node FD1 and the first common node CN1 to a predetermined level (e.g., the pixel voltage VDD). When the first reset transistor RX1 is turned on, the first transmission transistor TX1 may be simultaneously turned on to reset the first common node CN1.

The first transmission transistor TX1 may be turned on in response to a logic high level of a first transmission signal TG1 supplied to a gate thereof, and thus transmit the photocharge, accumulated in the first common node CN1, to the first floating diffusion node FD1.

A first boosting transistor BX1 may be provide an additional capacitance to the first floating diffusion node FD1 in response to a boosting voltage Vbt supplied to a gate thereof. The first boosting transistor BS1 may be coupled to the first floating diffusion node FD1 while a source and drain thereof form one node. Thus, the first boosting transistor BS1 may operate as a capacitive element (for example, MOS (Metal-Oxide-Semiconductor) capacitor), and have a capacitance corresponding to the boosting voltage Vbt.

The row driver 41 may control the boosting voltage Vbt according to the luminous intensity of incident light, and adjust the capacitance of the first floating diffusion node FD1. Thus, under a high luminance condition, the first floating diffusion node FD1 can accumulate more photocharge, which makes it possible to secure a high dynamic range.

In accordance with another embodiment, the boosting voltage Vbt may be constantly retained to continuously provide a predetermined capacitance to the first floating diffusion node FD1.

In accordance with still another embodiment, the first boosting transistor BX1 may be omitted.

The first source follower transistor SF1 may have a drain coupled to the pixel voltage VDD and a source coupled to the first selection transistor SX1, and transfer a current, corresponding to the potential of the first floating diffusion node FD1 coupled to a gate thereof, to the first selection transistor SX1.

The first selection transistor SX1 may be turned on in response to a logic high level of a first selection signal SEL1 supplied to a gate thereof, and output a first pixel output signal OUT1 transferred from the first source follower transistor SF1. The first pixel output signal OUT1 may be transferred to the readout circuit 45 through a vertical signal line (not illustrated) extended in the column direction of the pixel array 30.

In order to process the photocharge accumulated in the second common node CN2, the circuit area 320 may include a second reset transistor RX2, a second transmission transistor TX_B, a second boosting transistor BX2, a second source follower transistor SF2 and a second selection transistor SX2. Since the elements for processing the photocharge accumulated in the second common node CN2 are configured and operated in the same manner as the above-described elements for processing the photocharge accumulated in the first common node CN1 except operation timings, the overlapping descriptions thereof will be omitted herein.

The first and second demodulation control signals DCS1 and DCS2 may be exactly out of phase. For example, the first demodulation control signal DCS1 may have the same phase as the light modulation signal MLS, and the second demodulation control signal DCS2 may have a phase difference of 180 degrees from the light modulation signal MLS. Therefore, the operation timings of the elements RX1, TX1, BX1, SF1 and SX1 for processing the photocharge accumulated in the first common node CN1 in response to the first demodulation control signal DCS1 may be different from those of the elements RX2, TX2, BX2, SF2 and SX2 for processing the photocharge accumulated in the second common node CN2 in response to the second demodulation control signal DCS2.

The pixel output signals OUT1 and OUT2 outputted to the readout circuit 45 from the circuit area 320 may be converted into image data through noise removal and analog-digital conversion.

The image processor (not illustrated) may calculate a phase difference from the light modulation signal MLS by performing an operation on the image data acquired from the photocharge accumulated in the first common node CN1 and the image data acquired from the photocharge accumulated in the second common node CN2, calculate depth information, indicating the distance to the target object 1, from a phase difference corresponding to each of the pixels, and generate a depth image including the depth information corresponding to each of the pixels.

Figure 4A:
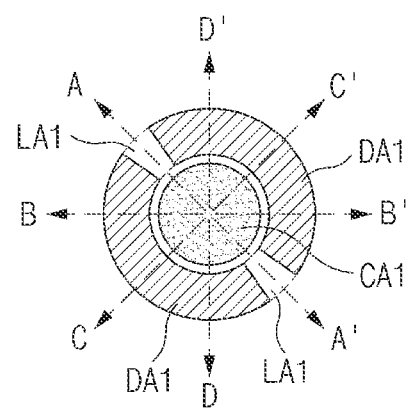
FIG. 4A is a diagram illustrating a first tap illustrated in FIG. 2.

FIG. 4A is a diagram illustrating the first tap illustrated in FIG. 2.

Referring to FIG. 4A, the first tap group may include the first tap TA1 and the fourth tap TA4 as described above. Since the structures of the first tap TA1 and the fourth tap TA4 correspond to each other, the following descriptions will be focused on the first tap TA1 with reference to FIGS. 4A, 5A to 5D and 6A, in order to avoid overlapping descriptions. However, the descriptions of the first tap TA1 may be applied in substantially the same manner to the fourth tap TA4.

The first tap TA1 may include the first control node CA1, the first detection node DA1 and the first low resistance regions LA1.

The first low resistance regions LA1 may be disposed on both sides of the first control node CA1 in the first diagonal direction, and a straight line connecting the first low resistance regions LA1 disposed on both sides will be defined as a first straight line A-A'. In one implementation, for example, the first diagonal direction may have a particular angle (e.g., an angle of 45 degrees) with respect to the row or column direction of the pixel array 30 while the pixel 200 may be in a square shape, and the angle of the first diagonal direction with respect to the row or column direction may be changed.

A second straight line B-B' may be defined as a straight line obtained by rotating the first straight line A-A' by 45 degrees in the counterclockwise direction about the first control node CA1.

A third straight line C-C' may be defined as a straight line obtained by rotating the first straight line A-A' by 90 degrees in the counterclockwise direction about the first control node CA1.

A fourth straight line D-D' may be defined as a straight line obtained by rotating the first straight line A-A' by 135 degrees in the counterclockwise direction about the first control node CA1.

Figure 4B:
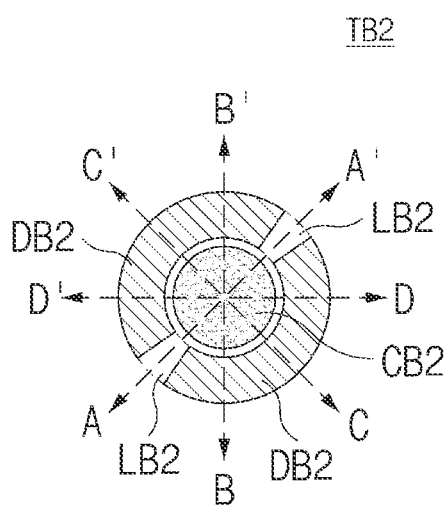
FIG. 4B is a diagram illustrating a second tap illustrated in FIG. 2.

FIG. 4B is a diagram illustrating the second tap illustrated in FIG. 2.

Referring to FIG. 4B, the second tap group may include the second tap TB2 and the third tap TB3 as described above. Since the structures of the second tap TB2 and the third tap TB3 correspond to each other, the following descriptions will be focused on the second tap TB2 with reference to FIGS. 4B, 5A to 5D and 6B, in order to avoid overlapping descriptions. However, the descriptions of the second tap TB2 may be applied in substantially the same manner to the third tap TB3.

The second tap TB2 may include the second control node CB2, the second detection node DB2 and the second low resistance regions LB2.

The second low resistance regions LB2 may be disposed on both sides of the second control node CB2 in the second diagonal direction, and a straight line connecting the second low resistance regions LB2 disposed on both sides will be defined as the first straight line A-A'. As an example, the second diagonal direction may be in a particular angle (e.g., an angle of 45 degrees) with respect to the row or column direction of the pixel array 30 while the pixel 200 may be in a square shape, and the angle of the second diagonal direction with respect to the row or column direction may be changed.

A second straight line B-B' may be defined as a straight line obtained by rotating the first straight line A-A' by 45 degrees in the counterclockwise direction about the second control node CB2.

A third straight line C-C' may be defined as a straight line obtained by rotating the first straight line A-A' by 90 degrees in the counterclockwise direction about the second control node CB2.

A fourth straight line D-D' may be defined as a straight line obtained by rotating the first straight line A-A' by 135 degrees in the counterclockwise direction about the second control node CB2.

The directions of the first to fourth straight lines A-A', B-B', C-C' and D-D' in FIG. 4A are different from those of the first to fourth straight lines A-A', B-B', C-C' and D-D' in FIG. 4B, but cross-sections taken along the first to fourth straight lines A-A', B-B', C-C' and D-D' in FIG. 4A are substantially the same as cross-sections taken along the first to fourth straight lines A-A', B-B', C-C' and D-D' in FIG. 4B.

FIGS. 5A to 5D show the cross-sections of the first and second taps TA1 and TB2, taken along the first to fourth straight lines A-A', B-B', C-C' and D-D'.

Figure 5A:
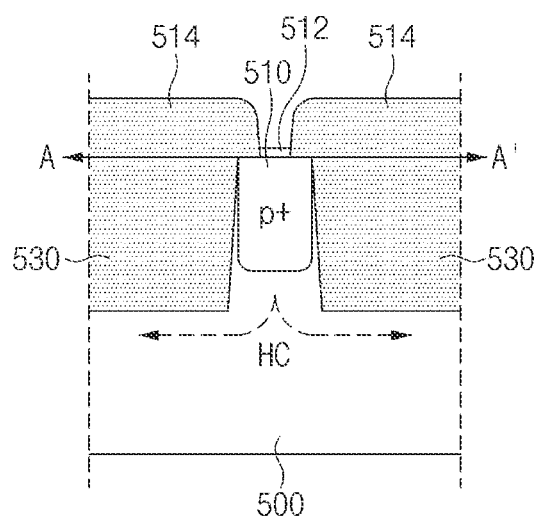
FIG. 5A is a cross-sectional view taken along a first straight line in FIG. 4A or 4B.
Figure 5B:
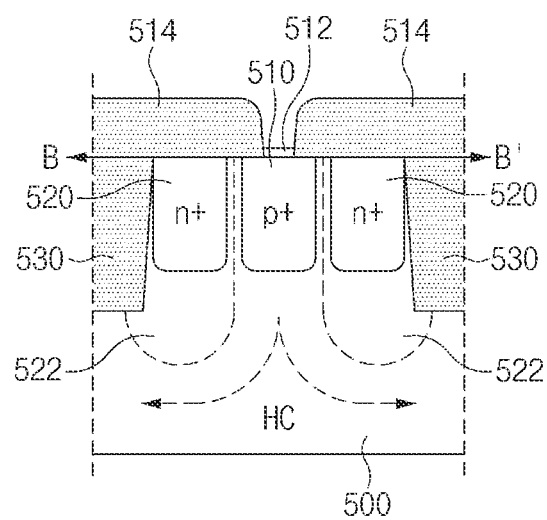
FIG. 5B is a cross-sectional view taken along a second straight line in FIG. 4A or 4B.
Figure 5C:
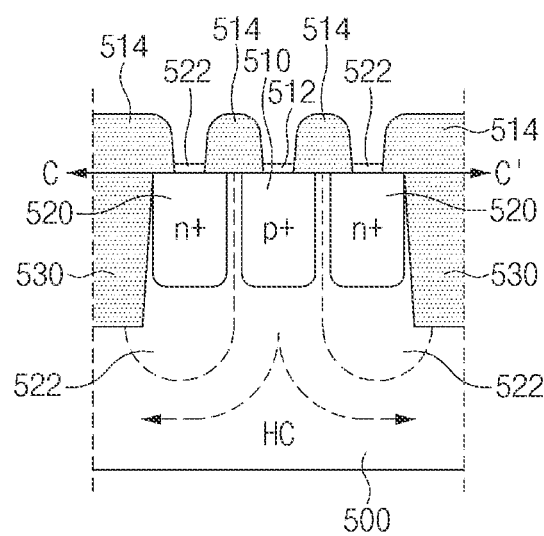
FIG. 5C is a cross-sectional view taken along a third straight line in FIG. 4A or 4B.
Figure 5D:
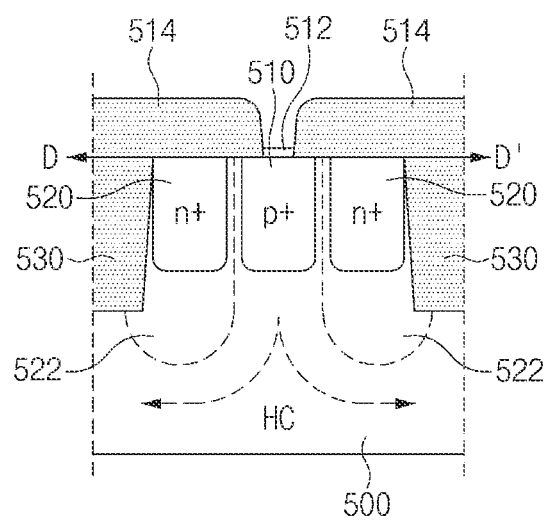
FIG. 5D is a cross-sectional view taken along a fourth straight line in FIG. 4A or 4B.

FIG. 5A is a cross-sectional view taken along the first straight line A-A' in FIG. 4A or 4B. FIG. 5B is a cross-sectional view taken along the second straight line B-B' in FIG. 4A or 4B. FIG. 5C is a cross-sectional view taken along the third straight line C-C' in FIG. 4A or 4B. FIG. 5D is a cross-sectional view taken along the fourth straight line D-D' in FIG. 4A or 4B.

The cross-section illustrated in FIG. 5A may correspond to a cross-section of the first or second tap TA1 or TB2, taken along the first straight line A-A' in FIG. 4A or 4B.

The cross-section may include a substrate 500, a first doping region 510, a control electrode 512, a substrate dielectric layer 514 and an isolation region 530.

The doping type arrangement for the different regions in a detection structure or tap dictates whether the charge current is a hole current or an electron current. In the example in FIGS. 5A-5D, the charge current is a hole current. The substrate 500 is a P-type bulk substrate, a substrate obtained by growing a P-type epitaxial layer in a P-type bulk substrate, or a substrate obtained by growing a P-type epitaxial layer in an N-type bulk substrate. Doping regions 510 and 520 can be p doped region and n-doped regions, respectively, as further explained below. In other implementations, the substrate 500 may be an N-type bulk substrate, a substrate obtained by growing an N-type epitaxial layer in a P-type bulk substrate, or a substrate obtained by growing an N-type epitaxial layer in an N-type bulk substrate. Under such designs, the doping regions 510 and 520 can be n doped region and p-doped regions, respectively and the charge current will be an electron current. In the following sections, it is assumed that each detection structure is implemented by the doping arrangement in FIGS. 5A-5D where a hole current HC is generated for the photosensing in each pixel.

The first doping region 510 may correspond to the first control node CA1 of FIG. 4A or the second control node CB2 of FIG. 4B. The first doping region 510 may be a region into which P+ impurities having a relatively high doping concentration are implanted in the substrate 500.

The control electrode 512 may receive the first or second demodulation control signal from the demodulation driver 42, and transfer the received first or second demodulation control signal to the first doping region 510. The control electrode 512 may include a metal or polysilicon with high electric conductivity. The control electrode 512 may be formed on one surface of the substrate 500.

The substrate dielectric layer 514 may be disposed on one surface of the substrate 500, and electrically insulate a region to or from which a signal does not need to be applied or outputted. For example, the substrate dielectric layer 514 may include one or more of silicon oxynitride ($Si_xO_yN_z$), silicon oxide ($Si_xO_y$) and silicon nitride ($Si_xN_y$) where x, y and z are natural numbers.

The isolation region 530 may be included in the first low resistance region LA1 of FIG. 4A or the second low resistance region LB2 of FIG. 4B. The isolation region 530 may be disposed on either side of the first doping region 510. Based on the one surface (for example, the top surface) of the substrate 500, the depth of the isolation region 530 may be larger than that of the first doping region 510. In accordance with another embodiment, the depth of the isolation region 530 may be equal to or smaller than that of the first doping region 510. The isolation region 530 may be formed through a process of forming a trench through an STI process, and then gap-filling the trench with a dielectric material. The dielectric material may include one or more of silicon oxynitride ($Si_xO_yN_z$), silicon oxide ($Si_xO_y$) and silicon nitride ($SixN_y$) where x, y and z are natural numbers. In some implementations, the isolation region 530 may be disposed in the open region of the detection node and can form at least a part of the low resistance region. In some implementations, the isolation region 530 may be not disposed in the open region of the detection node and does not form the low resistance region.

The cross-section illustrated in FIG. 5B may correspond to a cross-section of the first or second tap TA1 or TB2, taken along the second straight line B-B' in FIG. 4A or 4B.

The cross-section may include the substrate 500, the first doping region 510, the control electrode 512, the substrate dielectric layer 514, a second doping region 520, a depletion region 522, and the isolation region 530. Since the structures and functions of the substrate 500, the first doping region 510, the control electrode 512, the substrate dielectric layer 514 and the isolation region 530 are substantially the same as those described with reference to FIG. 5A, the overlapping descriptions thereof will be omitted herein.

The second doping region 520 may correspond to the first detection node DA1 of FIG. 4A or the second detection node DB2 of FIG. 4B. The second doping region 520 may be a region into which N+ impurities having a relatively high doping concentration are implanted in the substrate 500. The second doping region 520 may be disposed on either side of the first doping region 510, and surround the first doping region 510.

In some implementations, the depth of the second doping region 520 may be set to be equal to that of the first doping region 510 and the depths of the first and second doping regions 510 and 520 may be smaller than the depth of the isolation region 530.

The depletion region 522 may be disposed under the second doping region 520, and formed by a PN junction in a region where the P-type substrate 500 and the N-type second doping region 520 abut on each other. In the depletion region 522, carriers (e.g., holes and electrons) may not be present. Based on the top surface of the substrate 500, the depth of the depletion region 522 may be larger than the depth of the isolation region 530 forming the first or second low resistance region LA1 or LB2.

The isolation region 530 may be disposed outside the second doping region 520 surrounding the first doping region 510, unlike that of FIG. 5A.

The cross-section illustrated in FIG. 5C may correspond to a cross-section of the first or second tap TA1 or TB2, taken along the third straight line C-C' in FIG. 4A or 4B. Since the cross-sections illustrated in FIGS. 5B and 5C are substantially the same as each other except some differences, the descriptions of FIG. 5B may be applied in the same manner to FIG. 5C.

The cross-section of FIG. 5C may further include a detection electrode 522, unlike the cross-section of FIG. 5B. The detection electrode 522 may transfer photocharge (i.e. electron) captured by the second doping region 520 to the first or second transmission transistor TX1 or TX2. Since the second doping region 520 forms one node, the photocharge accumulated in the second doping region 520 may be outputted through the detection electrode 522 which is formed to correspond to a part of the second doping region 520. Therefore, the detection electrode 522 does not need to be formed across the entire second doping region 520. In the present embodiment, the detection electrode 522 may be formed in an area of the second doping region 520, which overlaps the third straight line C-C'. The detection electrode 522 may include a metal or polysilicon with high electric conductivity. The detection electrode 522 may be formed on the top surface of the substrate 500.

The cross-section illustrated in FIG. 5D may correspond to a cross-section of the first or second tap TA1 or TB2, taken along the fourth straight line D-D' in FIG. 4A or 4B. Since the cross-sections illustrated in FIGS. 5B and 5D are substantially the same as each other, the descriptions of FIG. 5B may be applied in the same manner to FIG. 5D.

When the first or second demodulation control signal DCS1 or DCS2 having an enable voltage is applied to the first doping region 510 through the control electrode 512, a hole current HC may flow toward an area to which a disable voltage is applied (e.g., the first doping region or voltage stabilization area to which the disable voltage is applied).

At this time, a path through which the hole current flows when the isolation region 530 is disposed adjacent to the first doping region 510 as illustrated in FIG. 5A may be different from a path through which the hole current flows when the second doping region 520 is disposed adjacent to the first doping region 510 as illustrated in FIGS. 5B to 5D.

When the isolation region 530 is disposed adjacent to the first doping region 510, the hole current HC outputted from the first doping region 510 bends at the bottom of the isolation region 530 where the hole current HC cannot flow, and then flows to the outside.

On the other hand, when the second doping region 520 is disposed adjacent to the first doping region 510, the hole current HC outputted from the first doping region 510 bends at the bottom of the depletion region 522 where the hole current HC cannot flow, and then flows to the outside.

Since the depth of the depletion region 522 is larger than the depth of the isolation region 530, the length of the path of the hole current HC which is outputted from the first doping region 510 and passed under the depletion region 522 may become larger than that of the path of the hole current HC which is outputted from the first doping region 510 and passed under the isolation region 530.

Figure 6A:
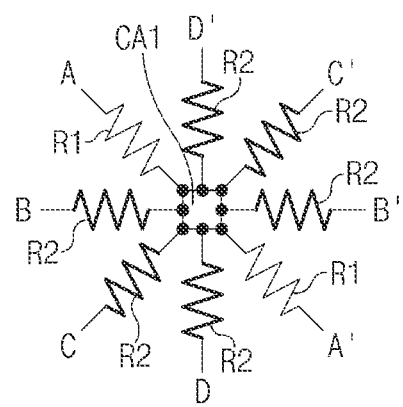
FIG. 6A is a diagram illustrating a structure obtained by modeling a first tap illustrated in FIG. 4A.

FIG. 6A is a diagram illustrating a structure configured by modeling the first tap illustrated in FIG. 4A.

FIG. 6A illustrates a first resistor model RM1 configured by modeling the first tap TA1 illustrated in FIG. 4A in a circuit manner.

For the hole current HC flowing in a random direction from the first control node CA1, a resistance component corresponding to each direction is present. The resistance component may indicate the extent to which the hole current HC may easily flow in each direction. The first tap TA1 may be modeled as a resistor having a small resistance value as the resistance component decreases, and modeled as a resistor having a large resistance value as the resistance component increases. The resistance component in each direction may be proportional to the length of the path through which the hole current HC flows in the direction.

Although eight directions A, A', B, B', C, C', D and D' around the first control node CA1 are described as examples but the same descriptions can be also applied to other directions than these 8 directions.

A resistance component corresponding to the direction A or A' may be modeled as a first resistor R1. The first resistor R1 may be decided by the length of the path through which the hole current HC flows in the direction A or A'. Since the path through which the hole current HC flows is relatively shortened by the isolation region 530 which is disposed adjacent to the first doping region 510 and has a relatively small depth, the first resistor R1 may have a relatively small resistance value.

A resistance component corresponding to the direction B, B', C, C', D or D' may be modeled as a second resistor R2 The second resistor R2 may be decided by the length of the path through which the hole current HC flows in the direction B, B', C, C', D or D'. Since the path through which the hole current HC flows is relatively lengthened by the second doping region 520 and the depletion region 522 which are disposed adjacent to the first doping region 510 and each have a relatively large depth, the second resistor R2 may have a relatively large resistance value.

Therefore, in the first tap TA1, the first resistor R1 corresponding to the first low resistance region LA1 may have a smaller resistance value than the second resistor R2 corresponding to the first detection node DA1.

Figure 6B:
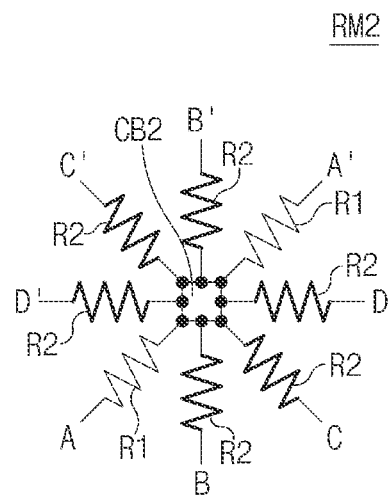
FIG. 6B is a diagram illustrating a structure formed by modeling a second tap illustrated in FIG. 4B.

FIG. 6B is a diagram illustrating a structure configured by modeling the second tap illustrated in FIG. 4B.

FIG. 6B illustrates a second resistor model RM2 configured by modeling the second tap TB2 illustrated in FIG. 4B in a circuit manner.

For the hole current HC flowing in a random direction from the second control node CB2, a resistance component corresponding to each direction is present.

Although eight directions A, A', B, B', C, C', D and D' around the second control node CB2 are described as examples, the same descriptions can be applied to other directions than these 8 directions.

A resistance component corresponding to the direction A or A' may be modeled as a first resistor R1. The first resistor R1 may be decided by the length of the path through which the hole current HC flows in the direction A or A'. Since the path through which the hole current HC flows is relatively shortened by the isolation region 530 disposed adjacent to the first doping region 510, the first resistor R1 may have a relatively small resistance value.

A resistance component corresponding to the direction B, B', C, C', D or D' may be modeled as a second resistor R2. The second resistor R2 may be decided by the length of the path through which the hole current HC flows in the direction B, B', C, C', D or D'. Since the path through which the hole current HC flows is relatively lengthened by the second doping region 520 and the depletion region 522 which are disposed adjacent to the first doping region 510, the second resistor R2 may have a relatively large resistance value.

Therefore, in the second tap TB2, the first resistor R1 corresponding to the second low resistance region LB2 may have a smaller resistance value than the second resistor R2 corresponding to the second detection node DB2.

Figure 7A:
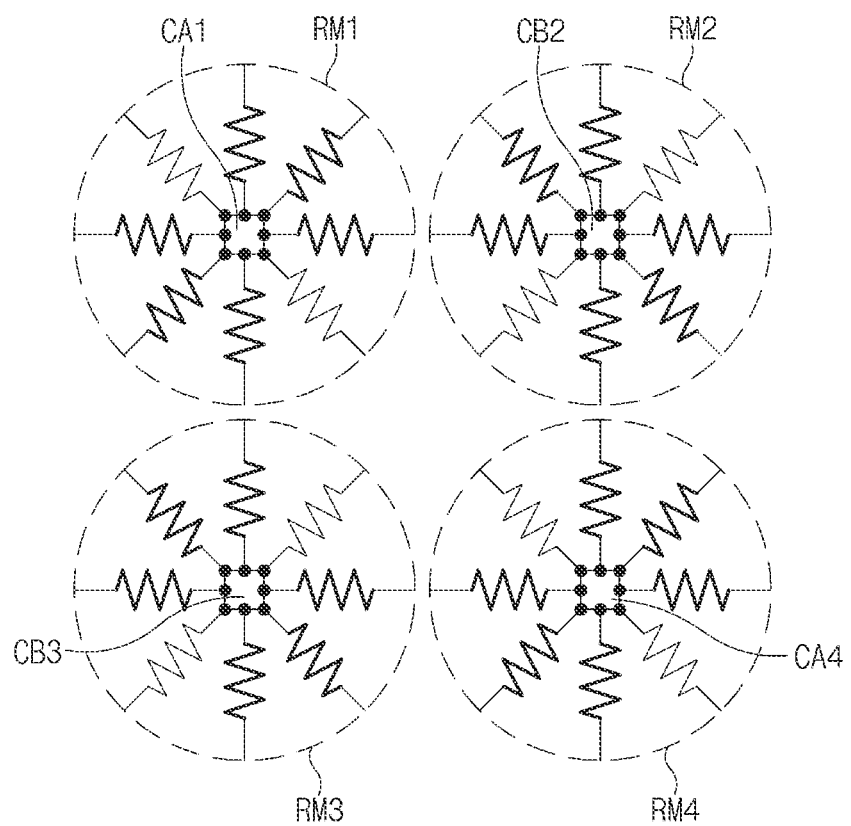
FIG. 7A is a diagram illustrating resistor models corresponding to first to fourth taps illustrated in FIG. 2.

FIG. 7A is a diagram illustrating resistor models corresponding to the first to fourth taps illustrated in FIG. 2.

FIG. 7A illustrates the first to fourth resistor models RM1 to RM4 corresponding to the first to fourth taps TA1, TB2, TB3 and TA4, respectively. The first and second resistor models RM1 and RM2 are configured as described above with reference to FIGS. 6A and 6B. Furthermore, in the drawings following FIG. 7A, a resistor indicated by a solid line with a relatively small thickness indicates the first resistor R1, and a resistor indicated by a solid line with a relatively large thickness indicates the second resistor R2.

Since the fourth tap TA4 has substantially the same structure as the first tap TA1, the fourth resistor model RM4 corresponding to the fourth tap TA4 may have substantially the same structure as the first resistor model RM1.

Since the third tap TB3 has substantially the same structure as the second tap TB2, the third resistor model RM3 corresponding to the third tap TB3 may have substantially the same structure as the second resistor model RM2.

Figure 7B:
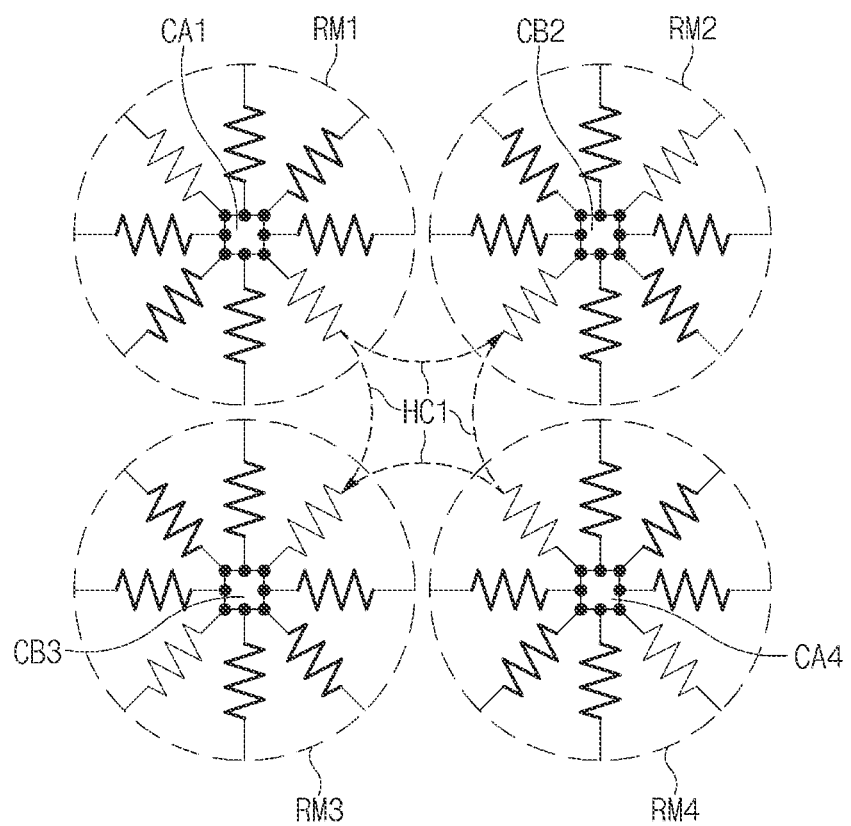
FIG. 7B is a diagram illustrating an example of directions of a hole current flowing among resistor models of FIG. 7A.

FIG. 7B is a diagram illustrating an example of the directions of a hole current flowing among the resistor models of FIG. 7A.

FIG. 7B illustrates paths of a first hole current HC1 flowing among the first to fourth taps TA1, TB2, TB3 and TA4 while the first demodulation control signal DCS1 having an enable voltage is applied to the first tap group (the first tap TA1 and the fourth tap TA4) and the second demodulation control signal DCS2 having a disable voltage is applied to the second tap group (the second tap TB2 and the third tap TB3).

Hereafter, a tap to which a demodulation control signal having an enable voltage is applied will be referred to as an enabled tap, and a tap to which a demodulation control signal having a disable voltage is applied will be referred to as a disabled tap.

The first hole current HC1 indicates a major hole current flowing among the first to fourth taps TA1, TB2, TB3 and TA4, and does not indicate that no hole current flows through paths other than the path of the first hole current HC1 among the first to fourth taps TA1, TB2, TB3 and TB4.

The hole current may flow from the first control node CA1 of the enabled first tap TA1 to the directions A, A', B, B', C, C', D and D' of the first resistor model RM1. However, since a resistance value corresponding to the directions B, B', C, C', D and D' in which the first detection node DA1 is disposed is larger than a resistance value corresponding to the directions A and A' in which the first low resistance region LA1 is disposed, most of the hole current flows in the directions A and A'.

Similarly, the hole current may flow from the fourth control node CA4 of the enabled fourth tap TA4 to the directions A, A', B, B', C, C', D and D' of the fourth resistor model RM4. However, since a resistance value corresponding to the directions B, B', C, C', D and D' in which the fourth detection node DA4 is disposed is larger than a resistance value corresponding to the directions A and A' in which the fourth low resistance region LA4 is disposed, most of the hole current flows in the directions A and A'.

The first hole current HC1 flowing from the first control node CA1 to the second control node CB2 may be decided by the sum of a current vector facing the direction A' of the first resistor model RM1 from the first control node CA1 and a current vector facing the second control node CB2 from the direction A of the second resistor model RM2. Therefore, the first hole current HC1 flowing from the first control node CA1 to the second control node CB2 may flow from the first control node CA1 to the direction A' of the first resistor model RM1. Then, as the direction of the first hole current HC1 is gradually changed toward the second control node CB2, the first hole current HC1 may flow from the direction A of the second resistor model RM2 toward the second control node CB2. The first hole current HC1 may flow from the first control node CA1 to the second control node CB2 through a path bending toward the center of the first to fourth taps TA1, TB2, TB3 and TA4.

The current vector may be obtained by expressing the direction and intensity of the hole current as a vector. The direction of the current vector may face a node having a low potential (low potential node) from a node having a high potential (high potential node), and the magnitude of the current vector may be decided by a potential difference between the high potential node and the low potential node and a resistance component between the high potential node and the low potential node.

The first hole current HC1 flowing from the first control node CA1 to the third control node CB3 may be decided by the sum of the current vector facing the direction A' of the first resistor model RM1 from the first control node CA1 and a current vector facing the third control node CB3 from the direction A' of the third resistor model RM3. Therefore, the first hole current HC1 flowing from the first control node CA1 to the third control node CB3 may flow from the first control node CA1 to the direction A' of the first resistor model RM1. Then, as the direction of the first hole current HC1 is gradually changed toward the third control node CB3, the first hole current HC1 may flow from the direction A' of the third resistor model RM3 toward the third control node CB3. That is, the first hole current HC1 may flow from the first control node CA1 to the third control node CB3 through a path bending toward the center of the first to fourth taps TA1, TB2, TB3 and TA4.

The first hole current HC1 flowing from the fourth control node CA4 to the second control node CB2 may be decided by the sum of a current vector facing the direction A of the fourth resistor model RM4 from the fourth control node CA4 and the current vector facing the second control node CB2 from the direction A of the second resistor model RM2. Therefore, the first hole current HC1 flowing from the fourth control node CA4 to the second control node CB2 may flow from the fourth control node CA4 to the direction A of the fourth resistor model RM4. Then, as the direction of the first hole current HC1 is gradually changed toward the second control node CB2, the first hole current HC1 may flow from the direction A of the second resistor model RM2 toward the second control node CB2. That is, the first hole current HC1 may flow from the fourth control node CA4 to the second control node CB2 through a path bending toward the center of the first to fourth taps TA1, TB2, TB3 and TA4.

The first hole current HC1 flowing from the fourth control node CA4 to the third control node CB3 may be decided by the sum of a current vector facing the direction A of the fourth resistor model RM4 from the fourth control node CA4 and the current vector facing the third control node CB3 from the direction A' of the third resistor model RM3. Therefore, the first hole current HC1 flowing from the fourth control node CA4 to the third control node CB3 may flow from the fourth control node CA4 to the direction A of the fourth resistor model RM4. Then, as the direction of the first hole current HC1 is gradually changed toward the third control node CB3, the first hole current HC1 may flow from the direction A' of the third resistor model RM3 toward the third control node CB3. That is, the first hole current HC1 may flow from the fourth control node CA4 to the third control node CB3 through a path bending toward the center of the first to fourth taps TA1, TB2, TB3 and TA4.

Taken together, the major hole current flowing from the enabled taps TA1 and TA4 to the disabled taps TB2 and TB3 may flow through the paths bending toward the center of the first to fourth taps TA1, TB2, TB3 and TA4.

Figure 7C:
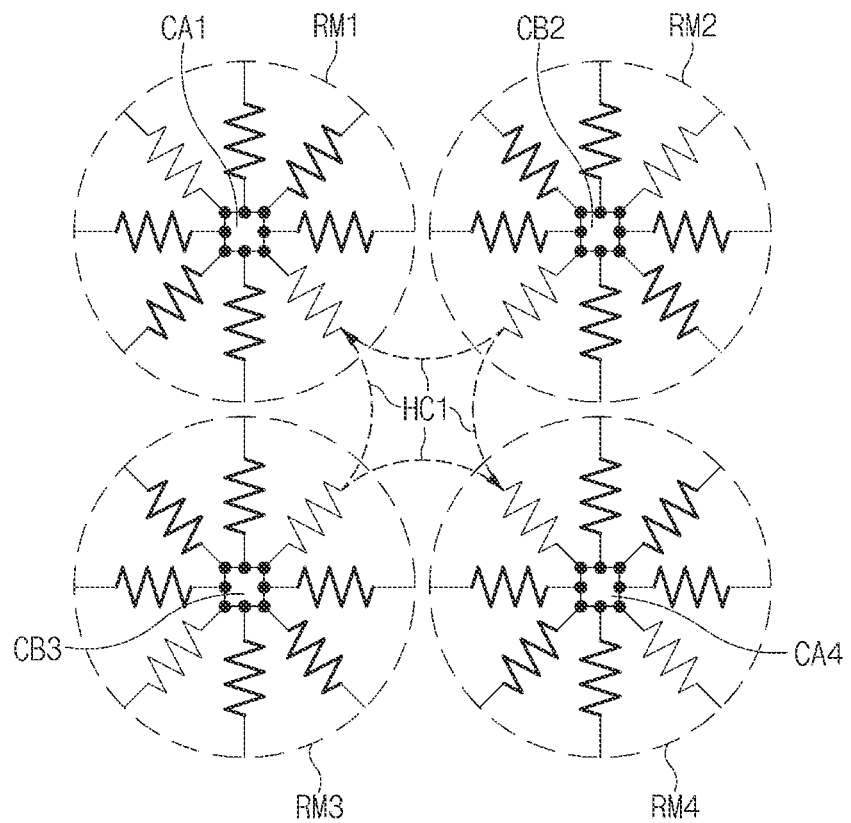
FIG. 7C is a diagram illustrating another example of directions of a hole current flowing among resistor models of FIG. 7A.

FIG. 7C is a diagram illustrating another example of the directions of a hole current flowing among the resistor models of FIG. 7A.

FIG. 7C illustrates paths of a second hole current HC2 flowing among the first to fourth taps TA1, TB2, TB3 and TA4 while the first demodulation control signal DCS1 having a disable voltage is applied to the first tap group (the first tap TA1 and the fourth tap TA4) and the second demodulation control signal DCS2 having an enable voltage is applied to the second tap group (the second tap TB2 and the third tap TB3).

The second hole current HC2 indicates a major hole current flowing among the first to fourth taps TA1, TB2, TB3 and TA4, and does not indicate that no hole current flows through paths other than the path of the second hole current HC2 among the first to fourth taps TA1, TB2, TB3 and TA4.

The hole current may flow from the second control node CB2 of the enabled second tap TA2 to the directions A, A', B, B', C, C', D and D' of the second resistor model RM2. However, since a resistance value corresponding to the directions B, B', C, C', D and D' in which the second detection node DB2 is disposed is larger than a resistance value corresponding to the directions A and A' in which the second low resistance region LB2 is disposed, most of the hole current flows in the directions A and A'.

Similarly, the hole current may flow from the third control node CB3 of the enabled third tap TB3 to the directions A, A', B, B', C, C', D and D' of the third resistor model RM3. However, since a resistance value corresponding to the directions B, B', C, C', D and D' in which the third detection node DB3 is disposed is larger than a resistance value corresponding to the directions A and A' in which the third low resistance region LB3 is disposed, most of the hole current flows in the directions A and A'.

The second hole current HC2 flowing from the second control node CB2 to the first control node CA1 may be decided by the sum of a current vector facing the direction A of the second resistor model RM2 from the second control node CB2 and a current vector facing the first control node CA1 from the direction A' of the first resistor model RM1. Therefore, the second hole current HC2 flowing from the second control node CB2 to the first control node CA1 may flow from the second control node CB2 to the direction A of the second resistor model RM2. Then, as the direction of the second hole current HC2 is gradually changed toward the first control node CA1, the second hole current HC2 may flow from the direction A' of the first resistor model RM1 toward the first control node CA1. That is, the second hole current HC2 may flow from the second control node CB2 to the first control node CA1 through a path bending toward the center of the first to fourth taps TA1, TB2, TB3 and TA4.

The second hole current HC2 flowing from the second control node CB2 to the fourth control node CA4 may be decided by the sum of the current vector facing the direction A of the second resistor model RM2 from the second control node CB2 and a current vector facing the fourth control node CA4 from the direction A of the fourth resistor model RM4. Therefore, the second hole current HC2 flowing from the second control node CB2 to the fourth control node CA4 may flow from the second control node CB2 to the direction A of the second resistor model RM2. Then, as the direction of the second hole current HC2 is gradually changed toward the fourth control node CA4, the second hole current HC2 may flow from the direction A of the fourth resistor model RM4 toward the fourth control node CA4. That is, the second hole current HC2 may flow from the second control node CB2 to the fourth control node CA4 through a path bending toward the center of the first to fourth taps TA1, TB2, TB3 and TA4.

The second hole current HC2 flowing from the third control node CB3 to the first control node CA1 may be decided by the sum of a current vector facing the direction A' of the third resistor model RM3 from the third control node CB3 and the current vector facing the first control node CA1 from the direction A' of the first resistor model RM1. Therefore, the second hole current HC2 flowing from the third control node CB3 to the first control node CA1 may flow from the third control node CB3 to the direction A' of the third resistor model RM3. Then, as the direction of the second hole current HC2 is gradually changed toward the first control node CA1, the second hole current HC2 may flow from the direction A' of the first resistor model RM1 toward the first control node CA1. That is, the second hole current HC2 may flow from the third control node CB3 to the first control node CA1 through a path bending toward the center of the first to fourth taps TA1, TB2, TB3 and TA4.

The second hole current HC2 flowing from the third control node CB3 to the fourth control node CA4 may be decided by the sum of a current vector facing the direction A' of the third resistor model RM3 from the third control node CB3 and a current vector facing the fourth control node CA4 from the direction A of the fourth resistor model RM4. Therefore, the second hole current HC2 flowing from the third control node CB3 to the fourth control node CA4 may flow from the third control node CB3 to the direction A' of the third resistor model RM3. Then, as the direction of the second hole current HC2 is gradually changed toward the fourth control node CA4, the second hole current HC2 may flow from the direction A of the fourth resistor model RM4 toward the fourth control node CA4. That is, the second hole current HC2 may flow from the third control node CB3 to the fourth control node CA4 through a path bending toward the center of the first to fourth taps TA1, TB2, TB3 and TA4.

Taken together, the major hole current flowing from the enabled taps TB2 and TB3 to the disabled taps TA1 and TA4 may flow through the paths bending toward the center of the first to fourth taps TA1, TB2, TB3 and TA4.

As described with reference to FIGS. 7B and 7C, the major hole current flowing from the enabled taps to the disabled taps flows through the paths bending toward the center of the first to fourth taps TA1, TB2, TB3 and TA4, which corresponds to the center of the pixel 200. Due to a micro-lens (not illustrated) which is disposed to overlap the pixel 200 in order to concentrate light into the pixel 200, the largest amount of photocharge may be generated at a location close to the center of the pixel 200. Therefore, as the hole current to induce photocharge to the enabled taps is passed through a path close to the center of the pixel 200, the photocharge generated in the corresponding time interval may be effectively captured by the enabled tap, which makes it possible to improve the sensitivity and demodulation contrast of the pixel 200.

Figure 8:
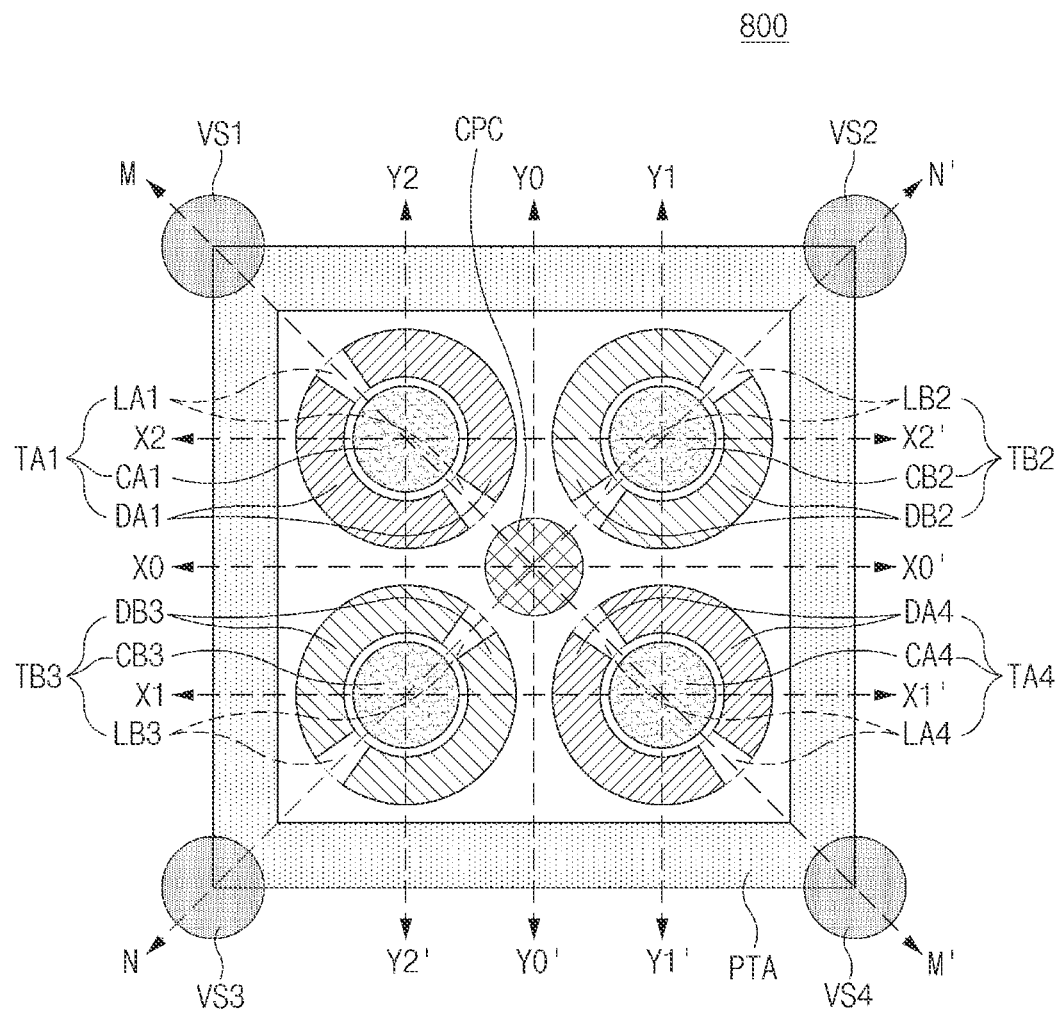
FIG. 8 is a diagram illustrating another example of a layout of a pixel illustrated in FIG. 1.

FIG. 8 is a diagram briefly illustrating another example of the layout of the pixel illustrated in FIG. 1.

Referring to FIG. 8, a pixel 800 may be any one of the pixels PX illustrated in FIG. 1. For convenience of description, one pixel 800 will be taken as an example for description. However, substantially the same structure and operation may be applied to a random pixel included in the pixel array 30.

The pixel 800 may include a first tap TA1, a second tap TB2, a third tap TB3, a fourth tap TA4, a pixel transistor area PTA, first to fourth voltage stabilization areas VS1 to VS4 and a current path control area CPC. Since the first tap TA1, the second tap TB2, the third tap TB3, the fourth tap TA4, the pixel transistor area PTA and the first to fourth voltage stabilization areas VS1 to VS4 are configured in substantially the same manner as those described with reference to FIG. 2, the overlapping descriptions thereof will be omitted herein.

The current path control area CPC may be disposed in the center of the pixel 800 or the center of the first to fourth taps TA1, TB2, TB3 and TA4.

The potential of the current path control area CPC may be controlled by a current path control voltage generated by the row driver 41 or the demodulation driver 42. The current path control voltage may have an absolute value which is smaller than that of an enable voltage of the first and second demodulation control signals DCS1 and DCS2 and larger than that of a disable voltage thereof. When it is assumed that the enable voltage and the disable voltage have the same polarity, the current path control voltage may have the opposite polarity to those of the enable voltage and the disable voltage. In accordance with an embodiment, the current path control voltage may have an absolute value corresponding to the average voltage (for example, 0.6V) of the enable voltage and the disable voltage. In order to reduce unnecessary power consumption, the current path control area CPC may receive the current path control voltage only in an interval where the pixel 800 is operated.

As the current path control area CPC receives the current path control voltage, the current path control area CPC may control the path of the first or second hole current HC1 or HC2 to bend closer to the center of the pixel 800. The detailed operation of the current path control area CPC will be described in detail below with reference to FIGS. 9A to 9C.

The current path control area CPC may include a current path dielectric layer disposed on a substrate, a current path electrode disposed over the current path dielectric layer and configured to receive the current path control voltage, and a region corresponding to the bottom of the current path electrode in the substrate. The electrode having received the current path control voltage may control the potential of the region corresponding to the bottom of the electrode in the substrate, such that the path of the first or second hole current HC1 or HC2 bends closer to the center of the pixel 800.

In accordance with another embodiment, the current path control area CPC may include a current path electrode disposed on a substrate and a region corresponding to the bottom of the current path electrode within the substrate. The current path electrode may not receive a separate current path control voltage, and the current path electrode formed of a metal or polysilicon and the substrate formed of silicon may be bonded to each other. In this case, a potential change may occur due to a difference in work function between the current path electrode and the substrate. The potential change may be used to control the potential of the region corresponding to the bottom of the electrode within the substrate. At this time, the current path electrodes within the pixel array 30 may be coupled to each other in a mesh type.

Hereafter, for convenience of description, the voltage of the current path control area CPC may indicate the voltage of the region corresponding to the bottom of the electrode of the current path control area CPC, and the voltage of the current path control area CPC may correspond to a medium voltage between the disable voltage and the enable voltage.

Figure 9A:
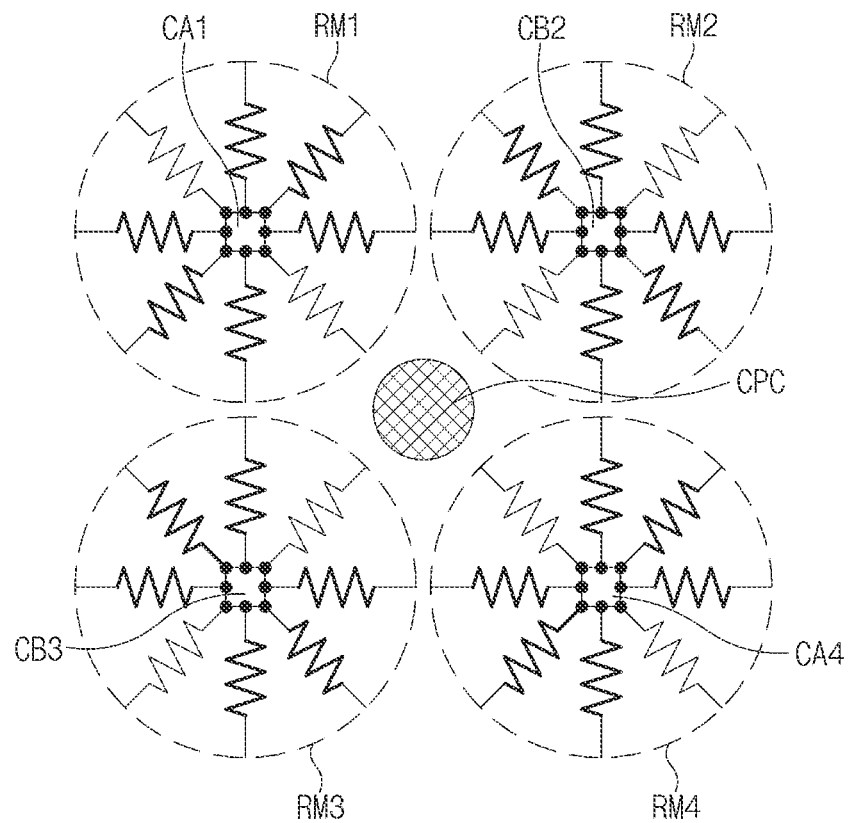
FIG. 9A is a diagram illustrating resistor models corresponding to first to fourth taps illustrated in FIG. 8.

FIG. 9A is a diagram illustrating resistor models corresponding to the first to fourth taps illustrated in FIG. 8.

FIG. 9A illustrates first to fourth resistor models RM1 to RM4 corresponding to the first to fourth taps TA1, TB2, TB3 and TA4, respectively. The first to fourth resistor models RM1 to RM4 may be configured in the same manner as those described above with reference to FIG. 7A.

In FIG. 9A, however, the current path control area CPC may be disposed in the center of the first to fourth resistor models RM1 to RM4.

Figure 9B:
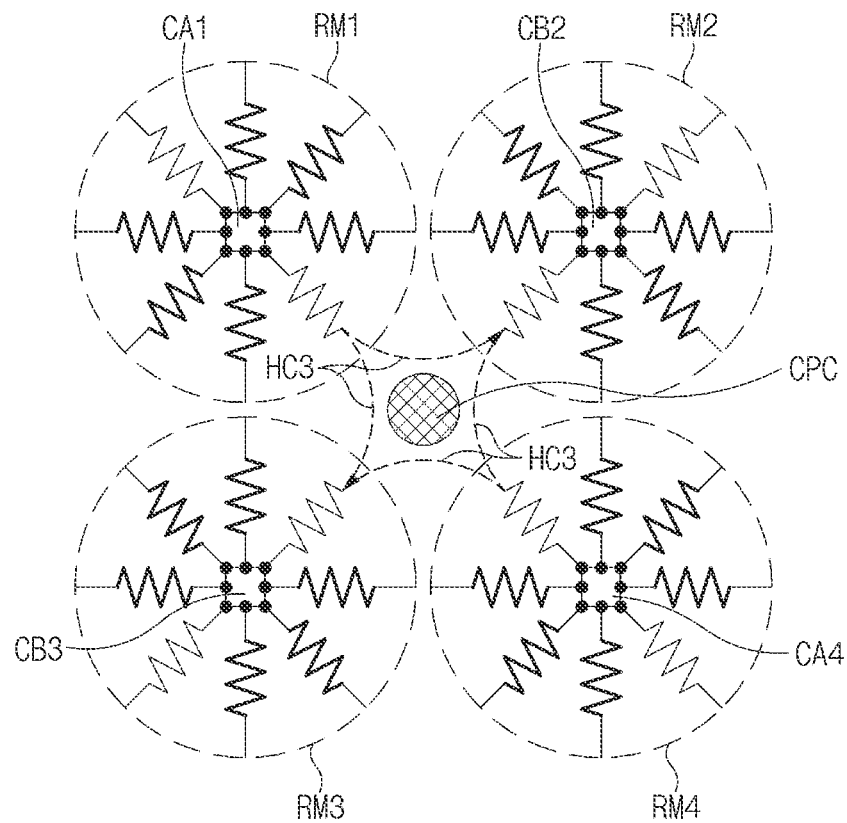
FIG. 9B is a diagram illustrating an example of directions of a hole current flowing among resistor models of FIG. 9A.

FIG. 9B is a diagram illustrating an example of the directions of a hole current flowing among the resistor models of FIG. 9A.

FIG. 9B illustrates paths of a third hole current HC3 flowing among the first to fourth taps TA1, TB2, TB3 and TA4 while the first demodulation control signal DCS1 having an enable voltage is applied to the first tap group (the first tap TA1 and the fourth tap TA4) and the second demodulation control signal DCS2 having a disable voltage is applied to the second tap group (the second tap TB2 and the third tap TB3).

Since paths of the third hole current HC3, e.g., paths through which the third hole current HC3 flows from the enabled taps TA1 and TA4 to the disabled taps TB2 and TB3 and which bend toward the center of the first to fourth taps TA1, TB2, TB3 and TA4 are basically similar to the paths of the first hole current HC1, the overlapping descriptions thereof will be omitted herein.

In FIG. 9B, the current path control area CPC may be disposed in the center of the first to fourth resistor models RM1 to RM4. Thus, current vectors to decide the path of the third hole current HC3 may be added. That is, as the current path control area CPC has a medium voltage between the disable voltage and the enable voltage, electric fields formed between the current path control area CPC and the first to fourth control nodes CA1, CB2, CB3 and CA4 may have an influence on the path of the third hole current HC3.

Specifically, the third hole current HC3 flowing from the first control node CA1 to the second control node CB2 may be decided by not only the sum of a current vector facing the direction A' of the first resistor model RM1 from the first control node CA1 and a current vector facing the second control node CB2 from the direction A of the second resistor model RM2, but also the sum of a current vector facing the current path control area CPC from the first control node CA1 and a current vector facing the second control node CB2 from the current path control area CPC. Therefore, the third hole current HC3 may flow from the first control node CA1 to the second control node CB2, through a path bending toward the center of the first to fourth taps TA1, TB2, TB3 and TA4, and have a path closer to the center of the first to fourth taps TA1, TB2, TB3 and TA4 than in FIG. 7B.

The third hole current HC3 flowing from the first control node CA1 to the third control node CB3 may be decided by not only the sum of the current vector facing the direction A' of the first resistor model RM1 from the first control node CA1 and a current vector facing the third control node CB3 from the direction A' of the third resistor model RM3, but also the sum of the current vector facing the current path control area CPC from the first control node CA1 and a current vector facing the third control node CB3 from the current path control area CPC. Therefore, the third hole current HC3 may flow from the first control node CA1 to the third control node CB3 through a path bending toward the center of the first to fourth taps TA1, TB2, TB3 and TA4, and have a path closer to the center of the first to fourth taps TA1, TB2, TB3 and TA4 than in FIG. 7B.

The third hole current HC3 flowing from the fourth control node CA4 to the second control node CB2 may be decided by not only the sum of a current vector facing the direction A of the fourth resistor model RM4 from the fourth control node CA4 and the current vector facing the second control node CB2 from the direction A of the second resistor model RM2, but also the sum of a current vector facing the current path control area CPC from the fourth control node CA4 and a current vector facing the second control node CB2 from the current path control area CPC. Therefore, the third hole current HC3 may flow from the fourth control node CA4 to the second control node CB2 through a path bending toward the center of the first to fourth taps TA1, TB2, TB3 and TA4, and have a path closer to the center of the first to fourth taps TA1, TB2, TB3 and TA4 than in FIG. 7B.

The third hole current HC3 flowing from the fourth control node CA4 to the third control node CB3 may be decided by not only the sum of the current vector facing the direction A of the fourth resistor model RM4 from the fourth control node CA4 and the current vector facing the third control node CB3 from the direction A' of the third resistor model RM3, but also the sum of a current vector facing the current path control area CPC from the fourth control node CA4 and the current vector facing the third control node CB3 from the current path control area CPC. Therefore, the third hole current HC3 may flow from the fourth control node CA4 to the third control node CB3 through a path bending toward the center of the first to fourth taps TA1, TB2, TB3 and TA4, and have a path closer to the center of the first to fourth taps TA1, TB2, TB3 and TA4 than in FIG. 7B.

Figure 9C:
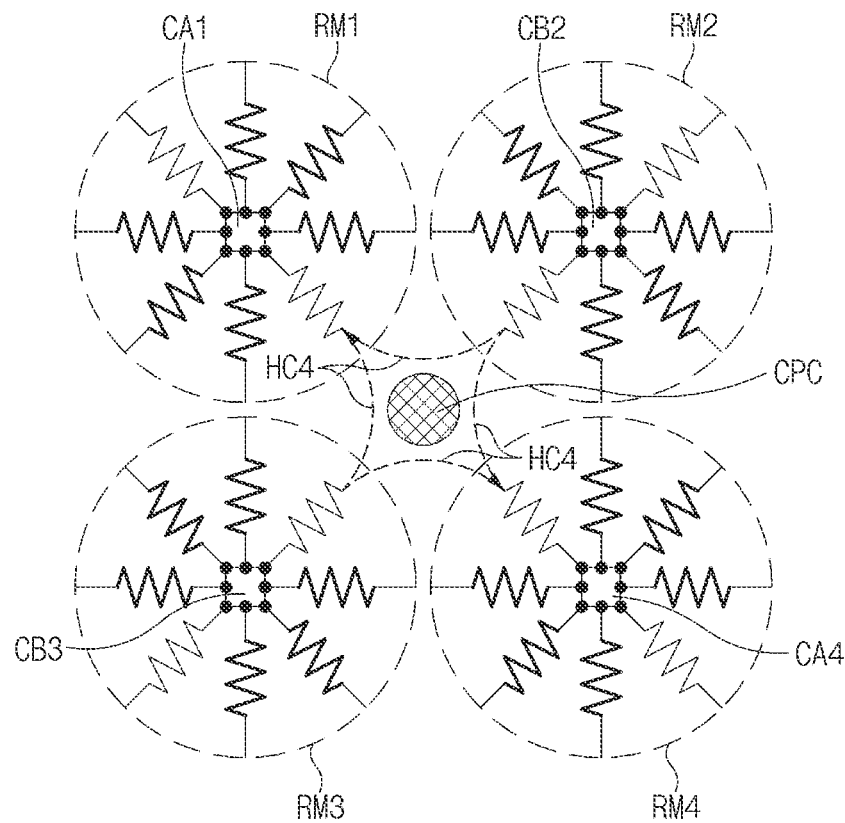
FIG. 9C is a diagram illustrating another example of directions of a hole current flowing among resistor models of FIG. 9A.

FIG. 9C is a diagram illustrating another example of the directions of a hole current flowing among the resistor models of FIG. 9A.

FIG. 9C illustrates paths of a fourth hole current HC4 flowing among the first to fourth taps TA1, TB2, TB3 and TA4 while the first demodulation control signal DCS1 having a disable voltage is applied to the first tap group (the first tap TA1 and the fourth tap TA4) and the second demodulation control signal DCS2 having an enable voltage is applied to the second tap group (the second tap TB2 and the third tap TB3).

Since paths of the fourth hole current HC4, i.e. paths through which the fourth hole current HC4 flows from the enabled taps TB2 and TB3 to the disabled taps TA1 and TA4 and which bends toward the center of the first to fourth taps TA1, TB2, TB3 and TA4 are basically similar to the paths of the second hole current HC2, the overlapping descriptions thereof will be omitted herein.

In FIG. 9C, the current path control area CPC may be disposed in the center of the first to fourth resistor models RM1 to RM4. Thus, current vectors to decide the paths of the fourth hole current HC4 are added. That is, as the current path control area CPC has a medium voltage between the disable voltage and the enable voltage, electric fields formed between the current path control area CPC and the first to fourth control nodes CA1, CB2, CB3 and CA4 may have an influence on the paths of the fourth hole current HC4.

Specifically, the fourth hole current HC4 flowing from the second control node CB2 to the first control node CA1 may be decided by not only the sum of a current vector facing the direction A of the second resistor model RM2 from the second control node CB2 and a current vector facing the first control node CA1 from the direction A' of the first resistor model RM1, but also the sum of a current vector facing the current path control area CPC from the second control node CB2 and a current vector facing the first control node CA1 from the current path control area CPC. Therefore, the fourth hole current HC4 may flow from the second control node CB2 to the first control node CA1 through a path bending toward the center of the first to fourth taps TA1, TB2, TB3 and TA4, and have a path closer to the center of the first to fourth taps TA1, TB2, TB3 and TA4 than in FIG. 7C.

The fourth hole current HC4 flowing from the second control node CB2 to the fourth control node CA4 may be decided by not only the sum of the current vector facing the direction A of the second resistor model RM2 from the second control node CB2 and a current vector facing the fourth control node CA4 from the direction A of the fourth resistor model RM4, but also the sum of the current vector facing the current path control area CPC from the second control node CB2 and a current vector facing the fourth control node CA4 from the current path control area CPC. Therefore, the fourth hole current HC4 may flow from the second control node CB2 to the fourth control node CA4 through a path bending toward the center of the first to fourth taps TA1, TB2, TB3 and TA4, and have a path closer to the center of the first to fourth taps TA1, TB2, TB3 and TA4 than in FIG. 7C.

The fourth hole current HC4 flowing from the third control node CB3 to the first control node CA1 may be decided by not only the sum of a current vector facing the direction A' of the third resistor model RM3 from the third control node CB3 and the current vector facing the first control node CA1 from the direction A' of the first resistor model RM1, but also the sum of a current vector facing the current path control area CPC from the third control node CB3 and the current vector facing the first control node CA1 from the current path control area CPC. Therefore, the fourth hole current HC4 may flow from the third control node CB3 to the first control node CA1 through a path bending toward the center of the first to fourth taps TA1, TB2, TB3 and TA4, and have a path closer to the center of the first to fourth taps TA1, TB2, TB3 and TA4 than in FIG. 7C.

The fourth hole current HC4 flowing from the third control node CB3 to the fourth control node CA4 may be decided by not only the sum of the current vector facing the direction A' of the third resistor model RM3 from the third control node CB3 and a current vector facing the fourth control node CA4 from the direction A of the fourth resistor model RM4, but also the sum of the current vector facing the current path control area CPC from the third control node CB3 and the current vector facing the fourth control node CA4 from the current path control area CPC. Therefore, the fourth hole current HC4 may flow from the third control node CB3 to the fourth control node CA4 through a path bending toward the center of the first to fourth taps TA1, TB2, TB3 and TA4, and have a path closer to the center of the first to fourth taps TA1, TB2, TB3 and TA4 than in FIG. 7C.

As described with reference to FIGS. 9B and 9C, the major hole current flowing from the enabled taps to the disabled taps flows through the paths bending toward the center of the first to fourth taps TA1, TB2, TB3 and TA4, which corresponds to the center of the pixel 800. Due to a micro-lens (not illustrated) which is disposed to overlap the pixel 200 in order to concentrate light into the pixel 800, the largest amount of photocharge may be generated at a location close to the center of the pixel 800. Therefore, as the hole current to induce photocharge to the enabled taps is passed through a path close to the center of the pixel 800, the photocharge generated in the corresponding time interval may be effectively captured by the enabled taps, which makes it possible to improve the sensitivity and demodulation contrast of the pixel 800.

Figure 10A:
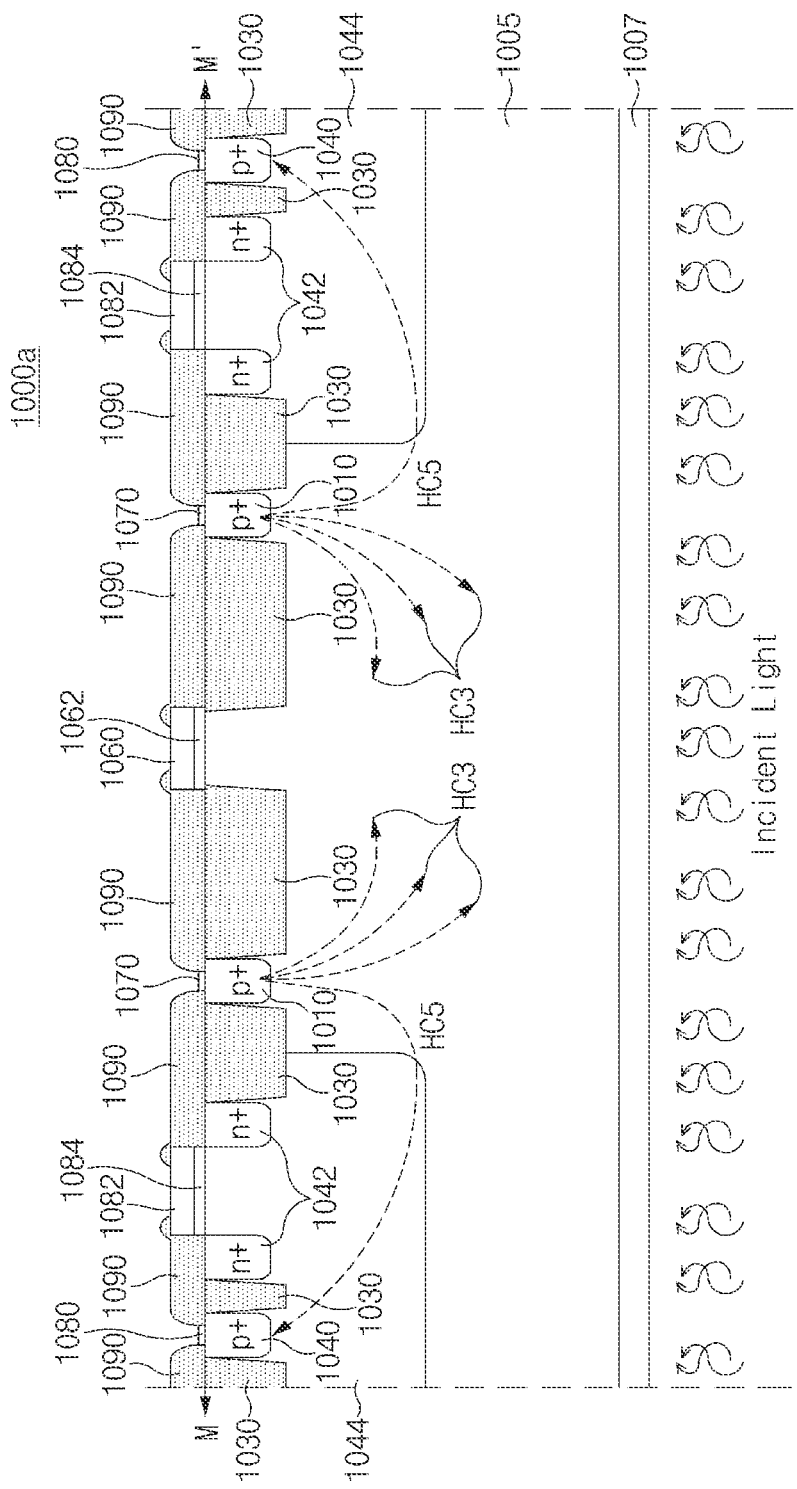
FIG. 10A is a cross-sectional view taken along a fifth straight line in FIG. 8.

FIG. 10A is a cross-sectional view taken along a fifth straight line in FIG. 8.

The cross-section illustrated in FIG. 10A may correspond to a cross-section of the pixel 800, taken along a fifth straight line M-M' in FIG. 8. The pixel 200 of FIG. 2 has substantially the same structure as the pixel 800 of FIG. 8 except the current path control area CPC. Thus, in the present disclosure, only the cross-section of the pixel 800 will be described with reference to FIGS. 10A to 10E, and the descriptions of a cross-section of the pixel 200 which does not include the current path control area CPC will be omitted.

FIGS. 10A to 10E illustrate that the pixel 800 has a BSI (Back-Side Illumination) structure, but the technical idea of the present disclosure may also be applied to an FSI (Front-Side Illumination) structure.

A cross-section 1000a may include a substrate 1005, the fifth doping region 1007, a first doping region 1010, an isolation region 1030, a third doping region 1040, a fourth doping region 1042, a well region 1044, a current path electrode 1060, a current path dielectric layer 1062, a control electrode 1070, a voltage stabilization electrode 1080, a gate electrode 1082, a gate dielectric layer 1084 and a substrate dielectric layer 1090. Since the substrate 1005, the first doping region 1010, the isolation region 1030, the control electrode 1070 and the substrate dielectric layer 1090 are substantially the same as the substrate 500, the first doping region 510, the isolation region 530, the control electrode 512 and the substrate dielectric layer 514, respectively, which have been described with reference to FIGS. 5A to 5D, the overlapping descriptions thereof will be omitted herein.

The fifth doping region 1007 may be disposed in the substrate 1005 along a surface of the substrate 1005, on which incident light is incident, and include P-type impurities having a higher doping concentration than the substrate 1005. In accordance with an embodiment, the fifth doping region 1007 may receive a substrate voltage, and generate a hole current in connection with an enabled tap, in order to induce photocharge, generated around the surface of the substrate 1005, to be detected through the enabled tap. For example, the substrate voltage may be a voltage lower than the enable voltage (for example, the disable voltage).

The first doping region 1010 may correspond to the first or fourth control node CA1 or CA4.

The third doping region 1040 may correspond to the first or fourth voltage stabilization area VS1 or VS4. The third doping region 1040 may be a P+ impurity region doped at a higher concentration than the well region 1044. The third doping region 1040 may be surrounded by the isolation region 1030.

The fourth doping region 1042 may correspond to the source and drain of a pixel transistor included in the pixel transistor area PTA. FIG. 10A illustrates that the pixel transistor is disposed on the cross-section taken along the fifth straight line M-M', in order to describe the structure of the pixel transistor. However, the pixel transistor does not need to be necessarily disposed on the cross-section taken along the fifth straight line M-M'. The isolation region 1030 may be disposed on one side of the fourth doping region 1042.

The well region 1044 may correspond to a P-well disposed under the pixel transistor area PTA and the corresponding voltage stabilization area. The well region 1044 may include P-type impurities with a predetermined concentration, and form the body of the pixel transistor so as to decide the element characteristics of the pixel transistor (for example, threshold voltage).

The current path electrode 1060 and the current path dielectric layer 1062 may correspond to a current path electrode and a current path dielectric layer which are included in the current path control area CPC. The current path electrode 1060 and the current path dielectric layer 1062 may be stacked on one surface of the substrate 1005. The current path electrode 1060 may include a metal or polysilicon with high electric conductivity. The current path dielectric layer 1062 may include one or more of silicon oxynitride ($Si_xO_yN_z$), silicon oxide ($Si_xO_y$) and silicon nitride ($Si_xN_y$) where x, y and z are natural numbers.

The voltage stabilization electrode 1080 may be disposed over the third doping region 1040, and transfer a disable voltage to the third doping region 1040.

The gate electrode 1082 and the gate dielectric layer 1084 may correspond to the gate of the pixel transistor. The gate electrode 1082 and the gate dielectric layer 1084 may be stacked over the region between the fourth doping regions 1042 adjacent to each other, i.e. a channel region. The gate electrode 1082 may include a metal or polysilicon with high electric conductivity. The gate dielectric layer 1084 may include one or more of silicon oxynitride ($Si_xO_yN_z$), silicon oxide ($Si_xO_y$) and silicon nitride ($Si_xN_y$) where x, y and z are natural numbers.

The structures illustrated in FIGS. 10A to 10E will be described under the supposition that the first demodulation control signal DCS1 having an enable voltage is applied to the first tap group (the first tap TA1 and the fourth tap TA4) and the second demodulation control signal DCS2 having a disable voltage is applied to the second tap group (the second tap TB2 and the third tap TB3). While the first demodulation control signal DCS1 having a disable voltage is applied to the first tap group (the first tap TA1 and the fourth tap TA4) and the second demodulation control signal DCS2 having an enable voltage is applied to the second tap group (the second tap TB2 and the third tap TB3), substantially the same technical idea may be applied only except the tap groups to/from the hole current is inputted/outputted.

The third hole current HC3 may be outputted from the first doping region 1010 to which the enable voltage is applied, through the first or fourth low resistance region LA1 or LA4 having a relatively low resistance value, and flow toward the first doping region (1010 of FIG. 10B) to which the disable voltage is applied.

Thus, a fifth hole current HC5 may flow as a major hole current that flows from the first doping region 1010, to which the enable voltage is applied, to the third doping region 1040 to which the disable voltage is applied. That is, the isolation region 1030 corresponding to the first or fourth low resistance region LA1 or LA4 may be disposed on either side of the first doping region 1010 on the cross-section 1000a. Thus, the hole current flowing from the first doping region 1010 to the third doping region 1040 may mostly flow through the first or fourth low resistance region LA1 or LA4.

The distance between the third doping region 1040 and the first doping region 1010 may be larger than the distance between the first doping region 1010 and the second doping region (1020 of FIG. 2). Thus, the structure of FIGS. 10A to 10E may have a larger resistance value. Therefore, the magnitude of the fifth hole current HC5 may be smaller than that of the third hole current HC3.

Figure 10B:
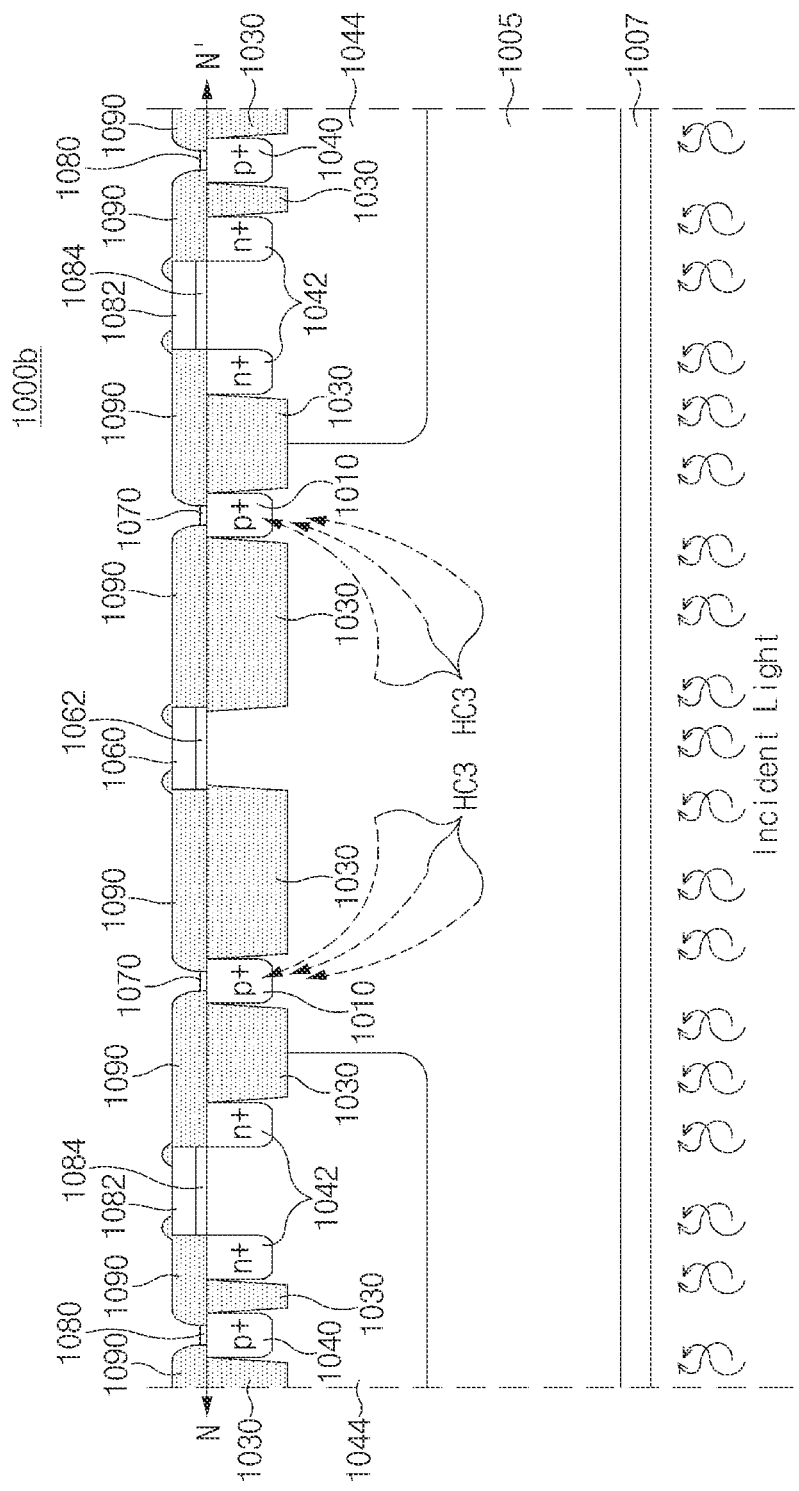
FIG. 10B is a cross-sectional view taken along a sixth straight line in FIG. 8.

FIG. 10B is a cross-sectional view taken along a sixth straight line in FIG. 8.

The cross-section illustrated in FIG. 10B may correspond to a cross-section of the pixel 800, taken along a sixth straight line N-N' in FIG. 8.

A cross-section 1000b may include a substrate 1005, a fifth doping region 1007, a first doping region 1010, an isolation region 1030, a third doping region 1040, a fourth doping region 1042, a well region 1044, a current path electrode 1060, a current path dielectric layer 1062, a control electrode 1070, a voltage stabilization electrode 1080, a gate electrode 1082, a gate dielectric layer 1084 and a substrate dielectric layer 1090. Since the components illustrated on the cross-section 1000b have substantially the same structures and functions as those of the components illustrated in the cross-section 1000a except some differences, the overlapping descriptions thereof will be omitted herein.

The first doping region 1010 may correspond to the second or third control node CB2 or CB3.

The third doping region 1040 may correspond to the second or third voltage stabilization area VS2 or VS3.

The third hole current HC3 may be outputted from the first doping region (1010 of FIG. 10A) to which the enable voltage is applied, and flow toward the first doping region 1010 to which the disable voltage is applied through the second or third low resistance region LB2 or LB3 having a relatively low resistance value.

Since the disable voltage is applied to each of the first and third doping regions 1010 and 1040 illustrated in FIG. 10B, no hole current may flow therebetween.

Figure 10C:
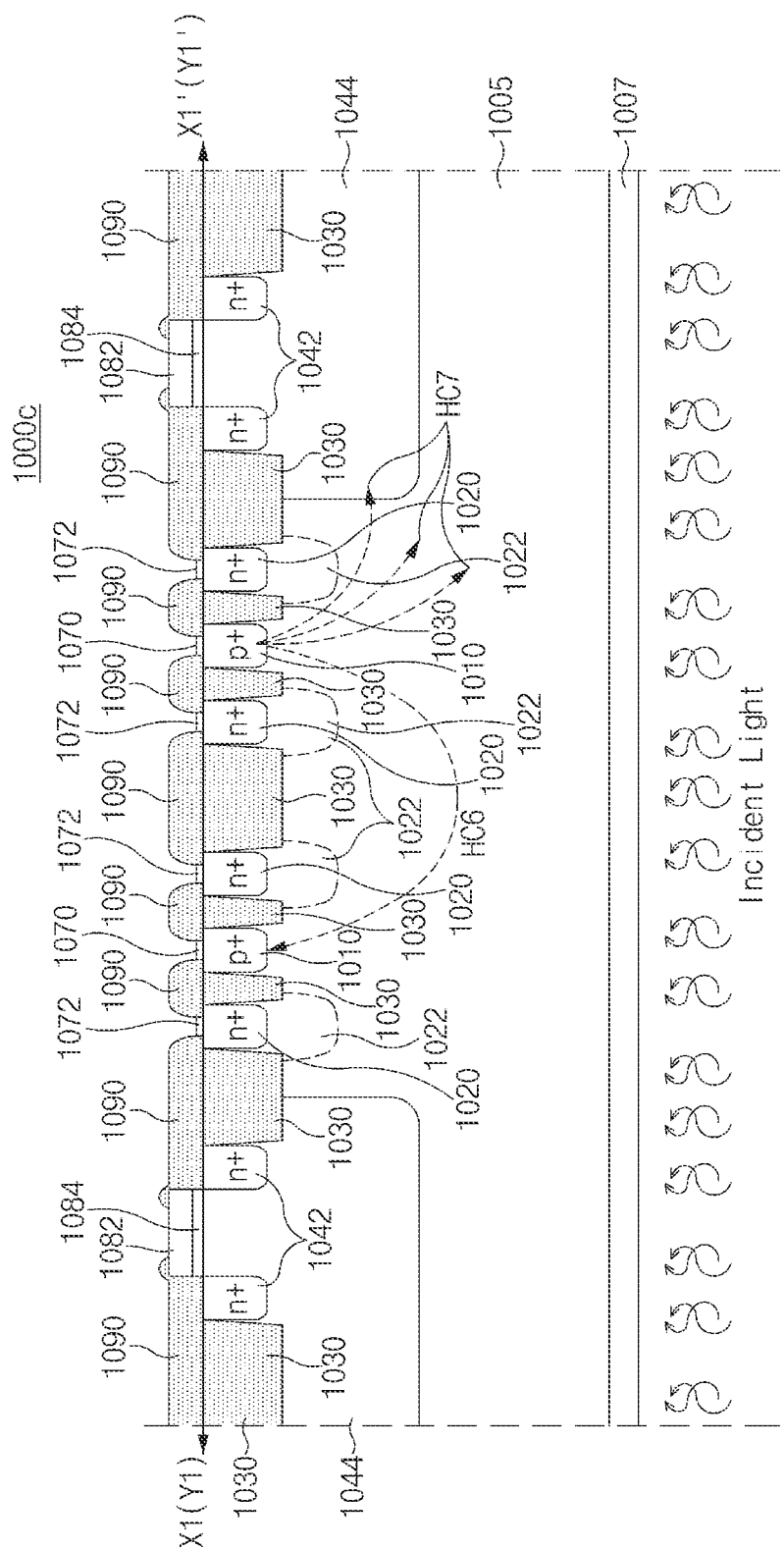
FIG. 10C is a cross-sectional view taken along a seventh straight line in FIG. 8.

FIG. 10C is a cross-sectional view taken along a seventh straight line in FIG. 8.

The cross-section illustrated in FIG. 10C may correspond to a cross-section of the pixel 800, taken along a seventh straight line X1-X1' or Y1-Y1' in FIG. 8.

A cross-section 1000c may include a substrate 1005, a fifth doping region 1007, a first doping region 1010, a second doping region 1020, a depletion region 1022, an isolation region 1030, a fourth doping region 1042, a well region 1044, a control electrode 1070, a detection electrode 1072, a gate electrode 1082, a gate dielectric layer 1084 and a substrate dielectric layer 1090. Since the components illustrated on the cross-section 1000c have substantially the same structures and functions as those of the components illustrated in the cross-section 1000a except some differences, the overlapping descriptions thereof will be omitted herein.

When the cross-section 1000c is a cross-section of the pixel 800, taken along the seventh straight line X1-X1', the first doping region 1010 may correspond to the third or fourth control node CB3 or CA4. When the cross-section 1000c is a cross-section of the pixel 800, taken along the seventh straight line Y1-Y1', the first doping region 1010 may correspond to the second or fourth control node CB2 or CA4.

When the cross-section 1000c is a cross-section of the pixel 800, taken along the seventh straight line X1-X1', the second doping region 1020 may correspond to the third or fourth detection node DB3 or DA4. When the cross-section 1000c is a cross-section of the pixel 800, taken along the seventh straight line Y1-Y1', the second doping region 1020 may correspond to the second or fourth detection node DB2 or DA4.

The depletion region 1022 may be formed to have a predetermined depth under the second doping region 1020. The predetermined depth may be decided by a voltage applied to the second doping region 1020 and the substrate 1005 and impurity concentrations of the second doping region 1020 and the substrate 1005.

Since the second doping region 1020 and the depletion region 1022 have substantially the same structures and functions as those of the second doping region 520 and the depletion region 522 which have been described with reference to FIG. 5B, the overlapping descriptions thereof will be omitted herein.

Since the disable voltage is applied to the first doping region 1010 on the left side of FIG. 10C and the enable voltage is applied to the first doping region 1010 on the right side thereof, a sixth hole current HC6 may flow on the cross-section 1000c. Specifically, the sixth hole current HC6 may be outputted from the first doping region 1010 to which the enable voltage is applied, passed under the depletion region 1022, and flow to the first doping region 1010 to which the disable voltage is applied. Since the detection nodes CB3 or CB2 and CA4 having a relatively high resistance value due to the depletion region 1022 are disposed on both sides of the first doping region 1010, the sixth hole current HC6 may have a smaller magnitude than the third hole current HC3.

Furthermore, a seventh hole current HC7 may flow on the cross-section 1000c. Specifically, the seventh hole current HC7 may flow from the first doping region 1010, to which the enable voltage is applied, to the third doping region (1040 of FIG. 10A or 10B) to which the disable voltage is applied. That is, since the detection nodes CB3 or CB2 and CA4 each having a relatively high resistance value are disposed on both sides of the first doping region 1010 on the cross-section 1000c, the seventh hole current HC7 having a smaller magnitude than the fifth hole current HC5 may flow through under the depletion region 1022.

Figure 10D:
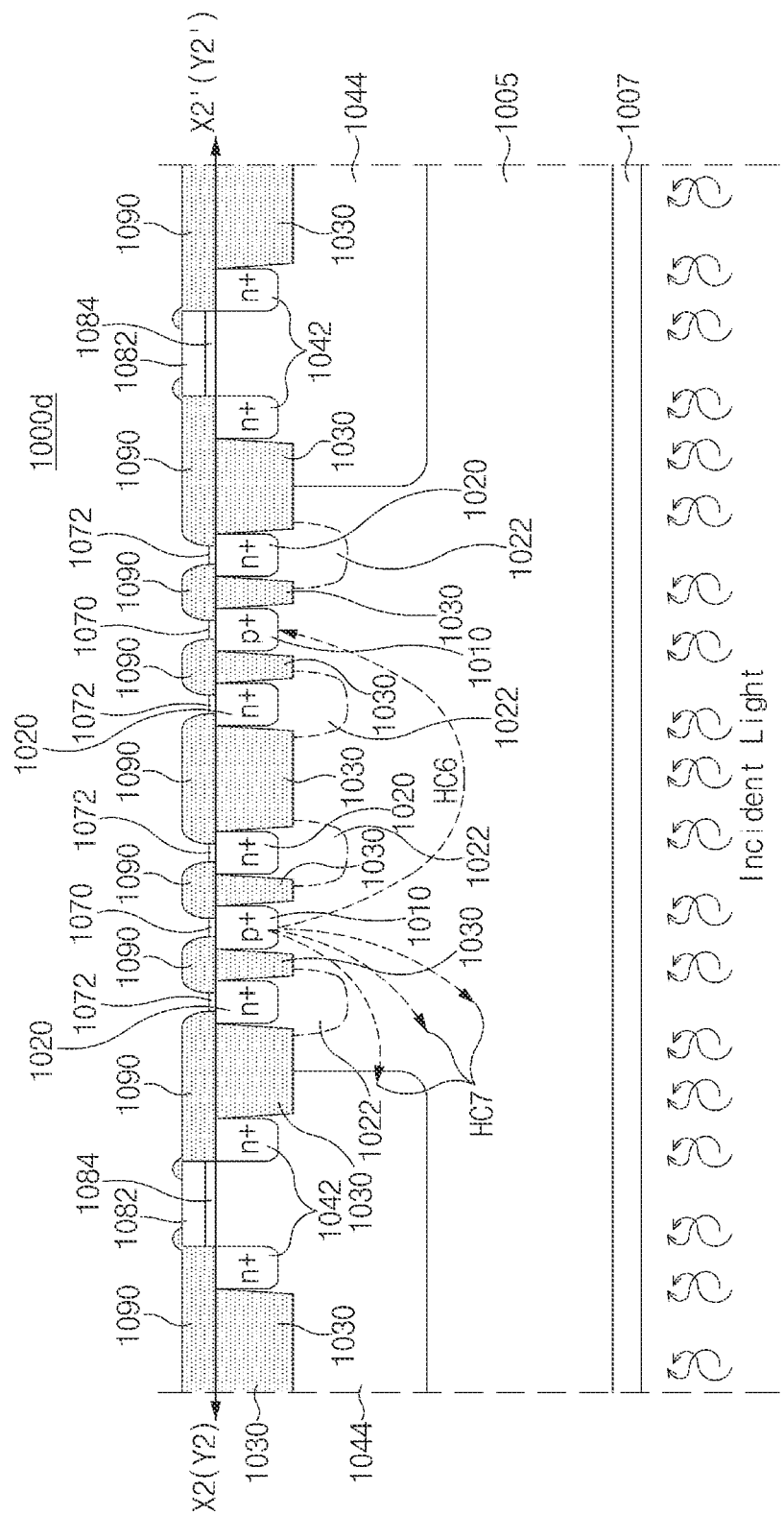
FIG. 10D is a cross-sectional view taken along an eighth straight line in FIG. 8.

FIG. 10D is a cross-sectional view taken along an eighth straight line in FIG. 8.

The cross-section illustrated in FIG. 10D may correspond to a cross-section of the pixel 800, taken along an eighth straight line X2-X2' or Y2-Y2' in FIG. 8.

Since the components illustrated on a cross-section 1000d have substantially the same structures and functions as those of the components illustrated in the cross-section 1000c except some differences, the overlapping descriptions thereof will be omitted herein.

When the cross-section 1000d is a cross-section of the pixel 800, taken along the eighth straight line X2-X2', the first doping region 1010 may correspond to the first or second control node CA1 or CB2. When the cross-section 1000d is a cross-section of the pixel 800, taken along the eighth straight line Y2-Y2', the first doping region 1010 may correspond to the first or third control node CA1 or CB3.

When the cross-section 1000d is a cross-section of the pixel 800, taken along the eighth straight line X2-X2', the second doping region 1020 may correspond to the first or second detection node DA1 or DB2. When the cross-section 1000d is a cross-section of the pixel 800, taken along the eighth straight line Y2-Y2', the second doping region 1020 may correspond to the first or third detection node DA1 or DB3.

Since the enable voltage is applied to the first doping region 1010 on the left side of FIG. 10D and the disable voltage is applied to the first doping region 1010 on the right side thereof, the sixth hole current HC6 may flow on the cross-section 1000d. Since the detection nodes CB3 or CB2 and CA4 each having a relatively high resistance value due to the depletion region 1022 are disposed on both sides of the first doping region 1010, the sixth hole current HC6 may have a smaller magnitude than the third hole current HC3.

Furthermore, the seventh hole current HC7 may flow on the cross-section 1000d. Specifically, the seventh hole current HC may flow from the first doping region 1010, to which the enable voltage is applied, to the third doping region (1040 of FIG. 10A or 10B) to which the disable voltage is applied. That is, since the detection nodes CA1 and CB3 or CB2 having a relatively high resistance value are disposed on both sides of the first doping region 1010 on the cross-section 1000d, the seventh hole current HC7 having a smaller magnitude than the fifth hole current HC5 may flow through under the depletion region 1022.

Figure 10E:
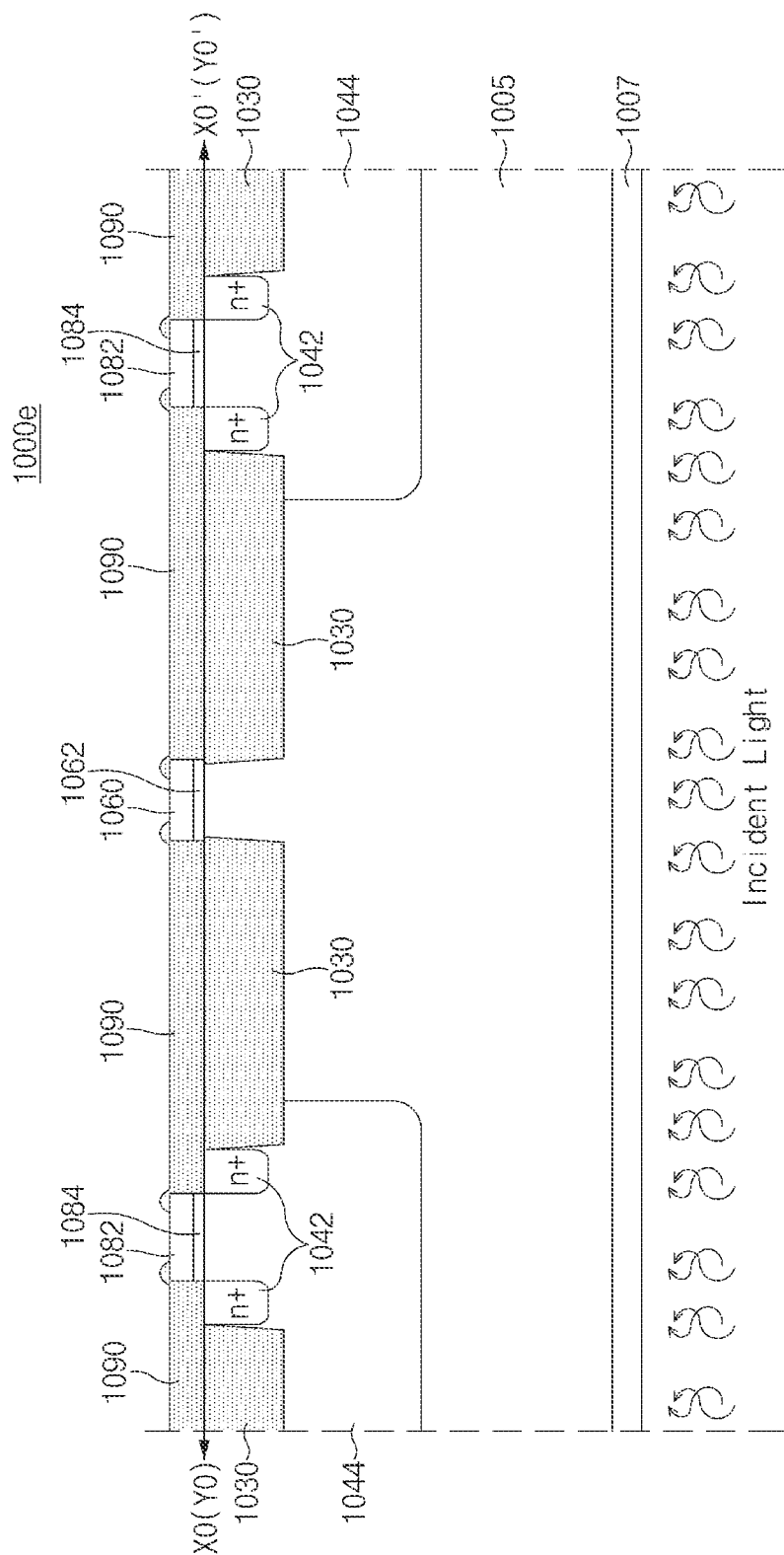
FIG. 10E is a cross-sectional view taken along a ninth straight line in FIG. 8.

FIG. 10E is a cross-sectional view taken along a ninth straight line in FIG. 8.

The cross-section illustrated in FIG. 10E may correspond to a cross-section of the pixel 800, taken along a ninth straight line X0-X0' or Y0-Y0' in FIG. 8.

A cross-section 1000e may include a substrate 1005, a fifth doping region 1007, an isolation region 1030, a fourth doping region 1042, a well region 1044, a current path electrode 1060, a current path dielectric layer 1062, a gate electrode 1082, a gate dielectric layer 1084 and a substrate dielectric layer 1090. Since the components illustrated on the cross-section 1000e have substantially the same structures and functions as those of the components illustrated in the cross-sections 1000a to 1000d except some differences, the overlapping descriptions thereof will be omitted herein.

Since the cross-section 1000e does not include the first and second doping regions, a cross-section of the pixel 800, taken along the ninth straight line X0-X0', may be the same as the cross-section of the pixel 800, taken along the ninth straight line Y0-Y0'.

Figure 11A:
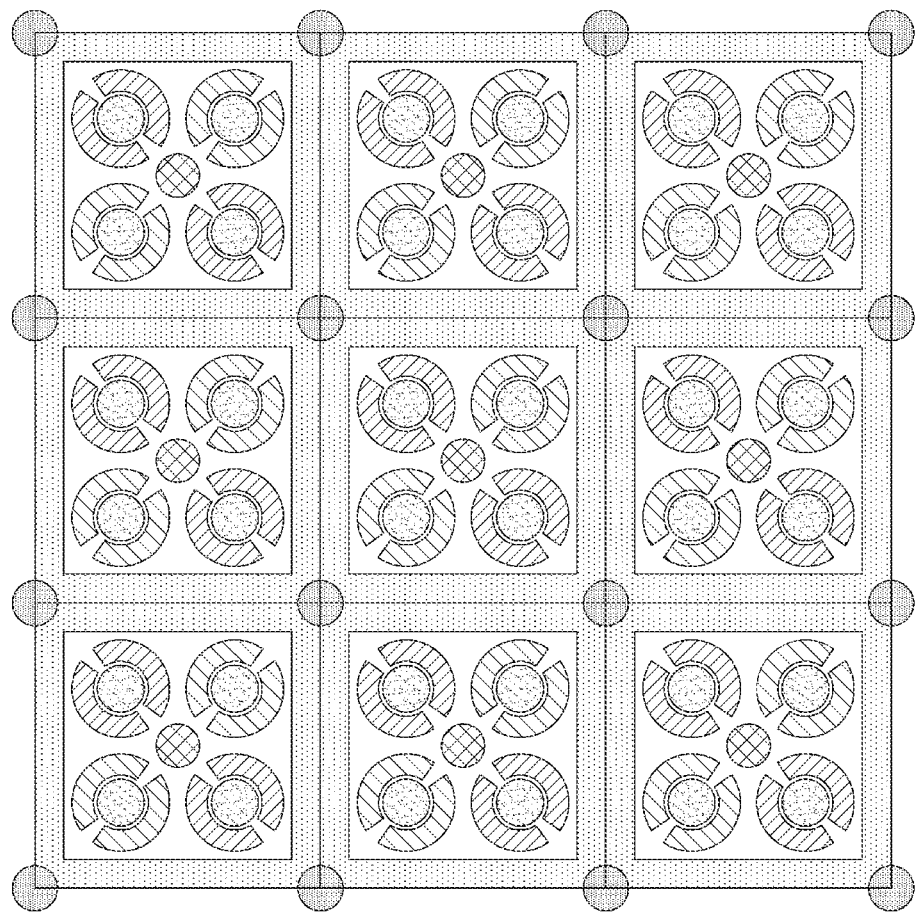
FIG. 11A is a diagram illustrating an example of a 3×3 matrix arrangement of pixels illustrated in FIG. 8.

FIG. 11A is a diagram illustrating that the pixels illustrated in FIG. 8 are arranged in a 3×3 matrix.

FIG. 11A illustrates nine pixels which are arranged in a 3×3 matrix including three rows and three columns. For convenience of description, FIG. 11A illustrates only nine pixels. However, the following descriptions may be applied in substantially the same manner to a pixel array 30 including pixels which are arranged in a matrix including a random number of rows and a random number of columns.

Referring to FIG. 11A, the first tap group including the first and fourth taps TA1 and TA4, the second tap group including the second and third taps TB2 and TB3, the current path control area disposed in the center of each pixel, the voltage stabilization area disposed at each vertex of each pixel, and the pixel transistor area disposed along the edge of each pixel are illustrated as different patterns.

A specific pixel may share one or more voltage stabilization areas with a pixel (first adjacent pixel) adjacent in the row direction (i.e. horizontal direction), a pixel (second adjacent pixel) adjacent to the column direction (i.e. vertical direction), a pixel (third adjacent pixel) adjacent in the first diagonal direction, or a pixel (fourth adjacent pixel) adjacent in the second diagonal direction.

In FIG. 11A, pixels belonging to a first row are sequentially defined as first to third pixels from the left, pixels belonging to a second row are sequentially defined as fourth to sixth pixels from the left, and pixels belonging to a third row are sequentially defined as seventh to ninth pixels from the left. At this time, for the fifth pixel P5 positioned in the center of the 3×3 matrix, the first adjacent pixel may include the fourth and sixth pixels, the second adjacent pixel may include the second and eighth pixels, the third adjacent pixel may be the first and ninth pixels, and the fourth adjacent pixel may include the third and seventh pixels.

The pixel transistor area of a specific pixel may be formed as one body with the pixel transistor area of the first or second adjacent pixel.

Figure 11B:
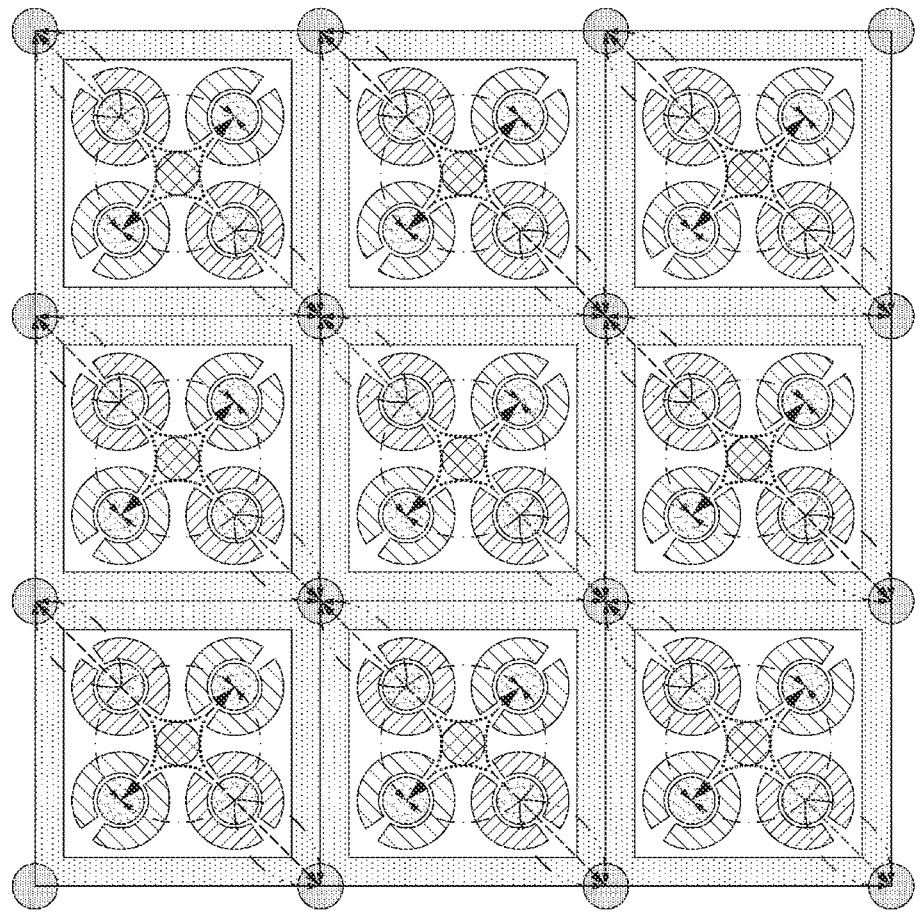
FIG. 11B is a diagram schematically illustrating an example of hole currents flowing through pixels illustrated in FIG. 11A.

FIG. 11B is a diagram schematically illustrating an example of hole currents flowing through the pixels illustrated in FIG. 11A.

FIG. 11B illustrates hole currents which flow while the first tap group is enabled and the second tap group is disabled. For convenience of description, the following descriptions will be focused on the pixel P5. However, the same descriptions may be applied to the other pixels.

Since the first tap group of the pixel P5 is enabled (ON) and the second tap group of the pixel P5 is disabled (OFF), a hole current may flow from the first tap group to the second tap group. The hole current flowing from the first tap group to the second tap group may include the third hole current HC3 and the sixth hole current HC6.

The third hole current HC3 may indicate a hole current which is outputted from the control node of the first tap group through the low resistance region of the first tap group, passed along a path which bends toward the center (or the current path control area) of the pixel P5, and then inputted to the control node of the second tap group through the low resistance region of the second tap group.

The sixth hole current HC6 may indicate a hole current which is outputted from the control node of the first tap group through the detection node of the first tap group, passed along a path which bends toward the control node of the second tap group, and then inputted to the control node of the second tap group through the detection node of the second tap group. In the present disclosure, when a hole current is outputted through a detection node, it may indicate that the hole current is outputted through the bottom of a depletion area abutting on the detection node.

Since the low resistance region has a lower resistance value than the detection node, the magnitude of the third hole current HC3 in the pixel P5 may be larger than the magnitude of the sixth hole current HC6.

Since the first tap group of the pixel P5 is enabled (ON) and the voltage stabilization areas of the pixel P5 receive the disable voltage, the hole current may flow from the first tap group to the voltage stabilization areas. The hole current flowing from the first tap group to the voltage stabilization areas may include the fifth hole current HC5 and the seventh hole current HC7.

The fifth hole current HC5 may indicate a hole current which is outputted from the control node of the first tap group through the low resistance region of the first tap group, passed along a straight path toward the voltage stabilization area, and then inputted to the voltage stabilization area.

The seventh hole current HC7 may indicate a hole current which is outputted from the control node of the first tap group through the detection node of the first tap group, passed along a path which bends toward the voltage stabilization area, and then inputted to the voltage stabilization area.

Since the low resistance region has a lower resistance value than the detection node, the magnitude of the fifth hole current HC5 in the pixel P5 may be larger than the seventh hole current HC7.

The taps included in the first tap group and the taps included in the second tap group may each include an inner low resistance region disposed toward the center of the pixel P5 based on the corresponding control node. The inner low resistance region may be included in the low resistance region. The inner low resistance region may be disposed between the center of the pixel P5 and the corresponding control node. Furthermore, the inner low resistance region may be disposed on a straight line connecting the center of the pixel P5 and the corresponding control node (or the center of the corresponding control node).

The inner low resistance region may be disposed to induce a major hole current, which flows from the first tap group to the second tap group, to flow along the path of the third hole current HC3. Therefore, the largest amount of photocharge may be generated at a location close to the center of the pixel P5 by the micro-lens, and moved to and captured by the first tap group, which makes it possible to improve the sensitivity and demodulation contrast of the pixel P5.

Furthermore, as the pixel P5 includes the current path control area, the path of the third hole current HC3 may bend more to approach the center of the pixel P5.

The taps included in the first tap group and the taps included in the second tap group may each include an outer low resistance region disposed toward each vertex of the pixel P5 based on the corresponding control node. The outer low resistance region may be included in the low resistance region. The outer low resistance region may be disposed between the vertex of the pixel P5 and the corresponding control node. Furthermore, the outer low resistance region may be disposed on a straight line connecting the vertex of the pixel P5 and the corresponding control node (or the center of the corresponding control node).

The outer low resistance region may be disposed to induce a major hole current, which flows from the first tap group to the outside of the pixel P5 (i.e. adjacent pixels), to flow along the path of the fifth hole current HC5. Therefore, the hole current outputted from the first tap group may be induced not to flow to the second tap group included in a pixel adjacent to the pixel P5, but to flow to the voltage stabilization area of the pixel P5, which makes it possible to prevent crosstalk between the pixels.

Figure 11C:
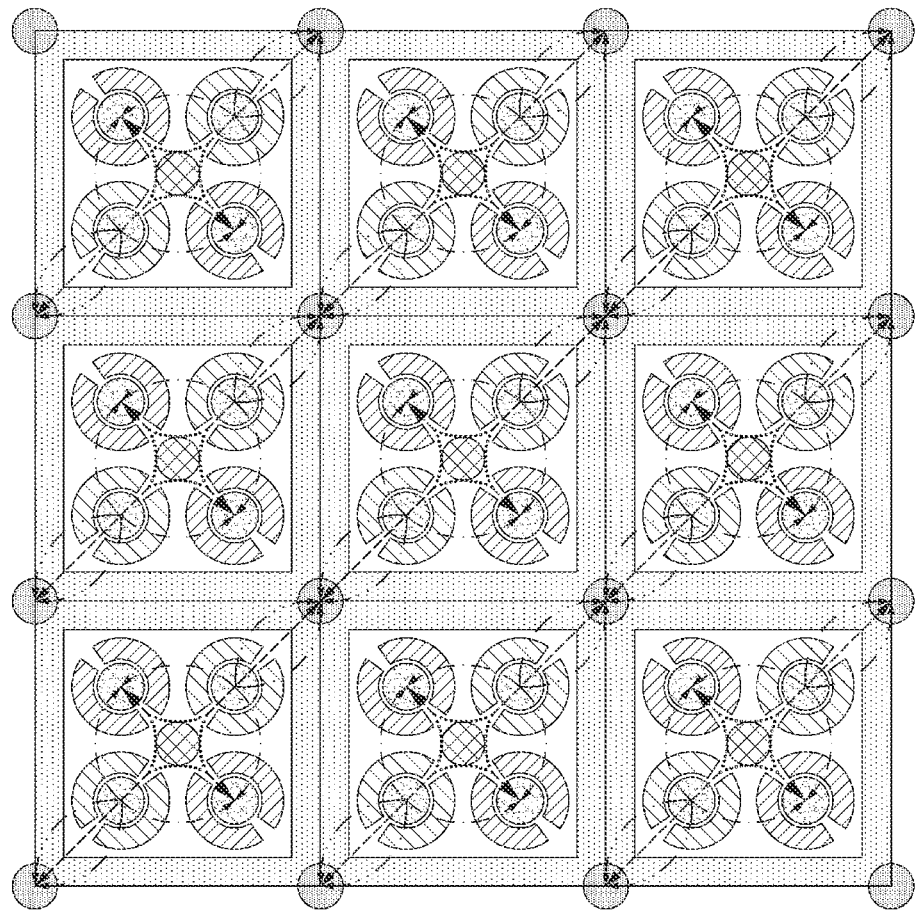
FIG. 11C is a diagram schematically illustrating another example of hole currents flowing through pixels illustrated in FIG. 11A.

FIG. 11C is a diagram schematically illustrating another example of the hole currents flowing through the pixels illustrated in FIG. 11A.

FIG. 11C illustrates hole currents which flow while the first tap group is disabled and the second tap group is enabled. For convenience of description, the following descriptions will be focused on the pixel P5. However, the same descriptions may be applied to the other pixels.

Since the first tap group of the pixel P5 is disabled (OFF) and the second tap group of the pixel P5 is enabled (ON), a hole current may flow from the second tap group to the first tap group. The hole current flowing from the second tap group to the first tap group may include the fourth hole current HC4 and the ninth hole current HC9. The fourth hole current HC4 and a ninth hole current HC9 may correspond to currents which flow in the opposite direction to the fourth hole current HC4 and the sixth hole current HC6, respectively.

The fourth hole current HC4 may indicate a hole current which is outputted from the control node of the second tap group through the low resistance region of the second tap group, passed along a path which bends toward the center (or the current path control area) of the pixel P5, and then inputted to the control node of the first tap group through the low resistance region of the first tap group.

The ninth hole current HC9 may indicate a hole current which is outputted from the control node of the second tap group through the detection node of the second tap group, passed along a path which bends toward the control node of the first tap group, and then inputted to the control node of the first tap group through the detection node of the first tap group.

Since the low resistance region has a lower resistance value than the detection node, the magnitude of the fourth hole current HC4 in the pixel P5 may be larger than that of the ninth hole current HC9.

Since the second tap group of the pixel P5 is enabled (ON) and the voltage stabilization areas of the pixel P5 receive the disable voltage, the hole current may flow from the second tap group to the voltage stabilization areas. The hole current flowing from the second tap group to the voltage stabilization areas may include the eighth hole current HC8 and the tenth hole current HC10.

The eighth hole current HC8 may indicate a hole current which is outputted from the control node of the second tap group through the low resistance region of the second tap group, passed along a straight path toward the voltage stabilization area, and then inputted to the voltage stabilization area.

The tenth hole current HC10 may indicate a hole current which is outputted from the control node of the second tap group through the detection node of the second tap group, passed along a path which bends toward the voltage stabilization area, and then inputted to the voltage stabilization area.

Since the low resistance region has a lower resistance value than the detection node, the magnitude of the eighth hole current HC8 in the pixel P5 may be larger than that of a tenth hole current HC10.

The taps included in the first tap group and the taps included in the second tap group may each include an inner low resistance region disposed toward the center of the pixel P5 based on the corresponding control node. The inner low resistance region may be disposed to induce a major hole current, which flows from the second tap group to the first tap group, to flow along the path of the fourth hole current HC4. Therefore, the largest amount of photocharge may be generated at a location close to the center of the pixel P5 by the micro-lens, and moved to and captured by the second tap group, which makes it possible to improve the sensitivity and demodulation contrast of the pixel P5.

Furthermore, as the pixel P5 includes the current path control area, the path of the fourth hole current HC4 may bend more to approach the center of the pixel P5.

The taps included in the first tap group and the taps included in the second tap group may each include an outer low resistance region disposed toward each vertex of the pixel P5 based on the corresponding control node. The outer low resistance region may be disposed to induce a major hole current, which flows from the second tap group to the outside of the pixel P5 (i.e. adjacent pixels), to flow along the path of the eighth hole current HC8. Therefore, the hole current outputted from the second tap group may be induced not to flow to the first tap group included in a pixel adjacent to the pixel P5, but to flow to the voltage stabilization area of the pixel P5, which makes it possible to prevent crosstalk between the pixels.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in a suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Furthermore, the separation of various system components in the embodiments described in this patent document should not be understood as requiring such separation in all embodiments.

What is claimed is:

1. An image sensing device, comprising:
   a pixel array including a plurality of pixels arranged in a matrix shape,
   wherein each of the plurality of pixels is structured to respond to incident light to produce photocharge indicative of detected incident light and comprises:
   a control node configured to receive a control signal for generating a current that carries the photocharge;
   a detection node spaced from the control node and configured to have a shape that surrounds the control node and includes an opening, the detection node operable to capture the photocharge migrated by the current; and
   a low resistance region disposed in the opening of the detection node, the low resistance region including a dielectric layer exhibiting a lower resistance than a resistance of the detection node,
   wherein the low resistance region includes an inner low resistance region disposed between the control node and a center of the pixel.

2. The image sensing device of claim 1, wherein the inner low resistance region is disposed on a straight line connecting the control node and the center of the pixel.

3. The image sensing device of claim 1, wherein the low resistance region further comprises an outer low resistance region disposed between a vertex of the pixel and the control node.

4. The image sensing device of claim 3, wherein the outer low resistance region is disposed on a straight line connecting the vertex of the pixel and the control node.

5. The image sensing device of claim 3, wherein the inner low resistance region and the outer low resistance region are disposed on opposite sides of the control node to face each other.

6. The image sensing device of claim 1, wherein the pixels further comprises:
   a voltage stabilization area disposed at a vertex of the pixel; and
   a pixel transistor area including at least one pixel transistor configured to process the photocharge generated in the pixel.

7. The image sensing device of claim 6, wherein the voltage stabilization area abuts on a well region forming the body of the at least one pixel transistor and is configured to receive a voltage to disable a transfer of the photocharges.

8. The image sensing device of claim 6, wherein the voltage stabilization area of the pixel is shared by the adjacent pixel in a row direction, column direction or diagonal direction of the pixel array.

9. The image sensing device of claim 1, wherein the dielectric layer is disposed at a predetermined depth from one surface of the substrate.

10. The image sensing device of claim 1, further comprising a depletion region disposed under the detection node,
   wherein a depth of the depletion region from one surface of the substrate is larger than a depth of the dielectric layer of the low resistance region.

11. The image sensing device of claim 1, wherein the control node, the detection node and the low resistance region are configured as a first tap structure and the pixel further includes second to fourth tap structures, each including a corresponding detection node and a corresponding control node.

12. The image sensing device of claim 11, wherein the first and fourth tap structures are configured to receive a first demodulation control signal for generating the current, and
   the second and third tap structures are configured to receive a second demodulation control signal for generating the current.

13. The image sensing device of claim 12, wherein the first demodulation control signal has a first voltage level to enable a transfer of the photocharges and the second demodulation control signal has a second voltage level to disable the transfer of the photocharges, and
   wherein the first and second demodulation control signals are out of phase with each other.

14. The image sensing device of claim 11, wherein the first and fourth tap structures are disposed in a first diagonal direction passing through the center of the pixel, and
   the second and third tap structures are disposed in a second diagonal direction different from the first diagonal direction and passing through the center of the pixel.

15. The image sensing device of claim 14, wherein the low resistance regions of the first and fourth tap structures are disposed in the first diagonal direction, and
   the low resistance regions of the second and third tap structures are disposed in the second diagonal direction.

16. The image sensing device of claim 1, wherein each of the pixels further comprises a current path control area disposed in the center of the pixel.

17. The image sensing device of claim 16, wherein the current path control area has a potential lower than that of the control node receiving a first voltage to enable a transfer of the photocharges, and higher than that of the control node receiving a second voltage to disable the transfer of the photocharge.

18. The image sensing device of claim 1, wherein the detection node and the low resistance region form a ring shape to surround the control node.

19. The image sensing device of claim 1, wherein, for the current, the low resistance region has lower resistance than the detection node.

* * * * *